US010088727B2

(12) United States Patent
Wada et al.

(10) Patent No.: US 10,088,727 B2
(45) Date of Patent: Oct. 2, 2018

(54) LIQUID CRYSTAL DEVICE AND ELECTRONIC APPARATUS

(71) Applicant: SEIKO EPSON CORPORATION, Tokyo (JP)

(72) Inventors: Masayuki Wada, Matsumoto (JP); Masashi Nakagawa, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 144 days.

(21) Appl. No.: 15/331,007

(22) Filed: Oct. 21, 2016

(65) Prior Publication Data

US 2017/0123250 A1    May 4, 2017

(30) Foreign Application Priority Data

Oct. 29, 2015  (JP) ................................ 2015-212624
Nov. 20, 2015  (JP) ................................ 2015-227375

(51) Int. Cl.
*G02F 1/1368*    (2006.01)
*G02F 1/1362*    (2006.01)
*H01L 29/786*    (2006.01)

(52) U.S. Cl.
CPC ...... *G02F 1/1368* (2013.01); *G02F 1/136209* (2013.01); *G02F 1/136227* (2013.01); *H01L 29/786* (2013.01); *G02F 2001/13685* (2013.01); *G02F 2001/136218* (2013.01); *H01L 29/78633* (2013.01)

(58) Field of Classification Search
CPC ......... G02F 1/1368; G02F 2001/13685; G02F 1/136209; G02F 2001/136218; G02F 1/136227; H01L 29/786; H01L 29/78633
See application file for complete search history.

(56) References Cited

U.S. PATENT DOCUMENTS

| | | | | |
|---|---|---|---|---|
| 2003/0025848 A1* | 2/2003 | Sera | .................. | G02F 1/136209 349/43 |
| 2004/0149989 A1* | 8/2004 | Matsunaga | ....... | H01L 29/78621 257/59 |
| 2005/0007512 A1* | 1/2005 | Matsunaga | ....... | G02F 1/136209 349/43 |
| 2005/0078240 A1* | 4/2005 | Murade | ............. | G02F 1/136209 349/110 |

(Continued)

FOREIGN PATENT DOCUMENTS

| | | |
|---|---|---|
| JP | 11-087726 A | 3/1999 |
| JP | 2003-131261 A | 5/2003 |
| JP | 2004-235557 A | 8/2004 |

(Continued)

*Primary Examiner* — Jia Pan
(74) *Attorney, Agent, or Firm* — Oliff PLC

(57) ABSTRACT

A liquid crystal device includes: a liquid crystal layer disposed on a first substrate; a first light shielding layer disposed between the first substrate and the liquid crystal layer; a second light shielding layer disposed between the first light shielding layer and the liquid crystal layer; a first transistor provided in a display region; and a second transistor provided in a peripheral region that is a region around the display region, in which the first transistor is disposed so as to overlap with at least the second light shielding layer in a plan view, and in which the second transistor is disposed so as to overlap with at least the first light shielding layer in a plan view.

19 Claims, 17 Drawing Sheets

LIGHT

(56) References Cited

U.S. PATENT DOCUMENTS

2006/0132667 A1 6/2006 Matsuzaki et al.
2012/0256184 A1* 10/2012 Kaneko ............ H01L 29/78621
　　　　　　　　　　　　　　　　　　　　　　257/59

FOREIGN PATENT DOCUMENTS

| JP | 2004-302475 A | 10/2004 |
| JP | 2005-159115 A | 6/2005 |
| JP | 2006-178235 A | 7/2006 |
| JP | 2011-158700 A | 8/2011 |
| JP | 2011-238835 A | 11/2011 |

* cited by examiner

LIQUID CRYSTAL DEVICE AND ELECTRONIC APPARATUS

BACKGROUND

1. Technical Field

The present invention relates to a liquid crystal device and an electronic apparatus.

2. Related Art

As the liquid crystal device, for example, an active driving type liquid crystal device in which a transistor for switching and controlling a pixel electrode is provided for each pixel, is known. The liquid crystal device is used, for example, as a liquid crystal light bulb of a liquid crystal projector as an electronic apparatus.

The liquid crystal device includes an element substrate, a counter substrate disposed opposite to the element substrate, and a liquid crystal layer interposed by the element substrate and the counter substrate. In the element substrate, the transistor and a light shielding layer for shielding light from the liquid crystal projector to the transistor are provided.

For example, in the liquid crystal device described in JP-A-2003-131261, a method of shielding light toward the transistor is disclosed, by providing the transistor on a substrate of a pixel region and providing a first light shielding film and a second light shielding film between the substrate and the transistor (active layer). In particular, as the amount of light of the liquid crystal projector increases, it is required to improve light shielding properties.

Even though strong light from a light source is incident to the liquid crystal light bulb, when light is irradiated to the semiconductor layer that constitutes the switching element, a flicker or pixel non-uniformity occurs on the display image by light leakage current, and this results in display quality degradation. Thus, improvement in the light shielding properties of incident light has been achieved from the related art. In recent years, there has been a case where the amount of light from the light source increases and an inorganic polarization plate having high light reflectivity compared to the related art is used. For this reason, a technique for improving the light shielding properties of the reflected light or the like that is incident from the side from which light of the liquid crystal device is emitted (back surface), has been proposed (for example, refer to JP-A-2004-5302475 and JP-A-2011-238835).

JP-A-2003-131261 discloses a configuration in which a scanning line (gate wiring) that is formed by stacking a metal light shielding film A, an insulating film (metal oxide film or metal nitride film) B, and a metal light shielding film C is disposed in the lower layer of the semiconductor layer of a reverse staggered (bottom gate) type TFT. JP-A-2004-5302475 discloses a configuration in which a first light shielding film and a second light shielding film that interpose an insulating film therebetween are stacked in the lower layer of the semiconductor layer and the potential of the second light shielding film is set to a gate potential or a constant voltage.

In a large liquid crystal device, there is an increasing need for driving using a high frequency driving signal. On the other hand, in a small liquid crystal device, though the arrangement pitch of the pixels is narrow, a light shielding region tends to be narrowed in order to increase the aperture ratio. For this reason, a technique for improving the light shielding properties and decreasing the wiring resistance has been proposed (for example, refer to JP-A-2011-158700). JP-A-2011-238835 discloses a configuration in which a scanning line that is formed by stacking the three layers of a metal film is disposed in the lower layer of the semiconductor layer.

However, in JP-A-2003-131261, although the configuration of the light shielding film in the pixel region is disclosed, the configuration of the light shielding film in the peripheral region around the pixel region is not disclosed. Further, when light is incident to the transistor in the peripheral region, there is a problem that light negatively affects the characteristics of the transistor such as the change in the characteristics of the transistor or the like.

In addition, in JP-A-2004-5302475 and JP-A-2011-238835, since two layers of the light shielding layer are insulated from each other, the wiring resistance of the scanning line is not considered. Further, in JP-A-2011-158700, since the light shielding layer (scanning line) is made of the three layers of a metal film that are stacked being in contact with each other, there is a concern that the light shielding properties are insufficient compared to a case where a layer having a different refractive index such as an insulating film or the like is interposed between the light shielding layers. Therefore, there is a demand for a display apparatus capable of improving the light shielding properties compared to the related art and decreasing the wiring resistance of the scanning line.

SUMMARY

The invention can be realized in the following aspects or application examples.

Application Example 1

According to this application example, there is provided a liquid crystal device, including: a substrate; a liquid crystal layer disposed on the substrate; a first light shielding layer disposed between the substrate and the liquid crystal layer; a second light shielding layer disposed between the first light shielding layer and the liquid crystal layer; a first transistor provided between the second light shielding layer and the liquid crystal layer in a display region; and a second transistor provided between the first light shielding layer and the liquid crystal layer in a peripheral region that is a region around the display region, in which the first transistor is disposed so as to overlap with at least the second light shielding layer in a plan view, and in which the second transistor is disposed so as to overlap with at least the first light shielding layer in a plan view.

In this application example, the first transistor of the pixel disposed in the display region overlaps with the second light shielding layer in a plan view, and thus, even in a case where light is incident to the display region, it is possible to shield the first transistor from light. On the other hand, the second transistor disposed in the peripheral region overlaps with the first light shielding layer in a plan view, and thus, for example, even in a case where light leaked from the outside is incident to the peripheral region, it is possible to shield the second transistor from light. The second light shielding layer is disposed in the layer closer to the first transistor than the first light shielding layer, and thus it is possible to further prevent light from being incident to the first transistor in a transmission region through which light is transmitted. Further, it is possible to improve the light shielding properties of light that is incident at an angle.

Application Example 2

In the liquid crystal device according to the application example, it is preferable that the first transistor is disposed so as to overlap with the first light shielding layer and the second light shielding layer in a plan view.

In this application example, the first transistor is disposed so as to overlap with the two layers of the first light shielding layer and the second light shielding layer in a plan view, and thus it is possible to further improve the light shielding properties of the first transistor in the region (display region) through which light is transmitted.

Application Example 3

In the liquid crystal device according to the application example, it is preferable that the first light shielding layer and the second light shielding layer are electrically connected to a gate electrode of the first transistor by one contact hole.

In this application example, the first light shielding layer and the second light shielding layer are electrically connected to the gate electrode, and thus it is possible to prevent a change in characteristics of the transistor such as a potential change or a floating. Further, the first light shielding layer and the second light shielding layer are electrically connected to the gate electrode by one contact hole, and thus it is possible to prevent a significant decrease in the aperture ratio. In addition, it is also possible to effectively correspond to a case where the pitch between pixels is narrowed.

Application Example 4

In the liquid crystal device according to the application example, it is preferable that at least one of the first light shielding layer and the second light shielding layer is made of a material having a light reflection property.

In this application example, the first light shielding layer and second light shielding layer have a light reflection property, and thus it is possible to prevent the first transistor and the second transistor (further, liquid crystal device) from heating.

Application Example 5

In the liquid crystal device according to the application example, it is preferable that materials of the first light shielding layer and the second light shielding layer are tungsten silicide.

In this application example, the first light shielding layer and the second light shielding layer are made of tungsten silicide, and thus it is possible to prevent the first transistor and the second transistor (further, liquid crystal device) from heating.

Application Example 6

According to this application example, there is provided a liquid crystal device including: a first substrate; a second substrate disposed opposite to the first substrate; a liquid crystal layer interposed between the first substrate and the second substrate; a switching element including a semiconductor layer that is disposed on the first substrate for each pixel and includes a channel region, a gate insulating layer covering the semiconductor layer, and a gate electrode disposed opposite to the channel region via the gate insulating layer; a first light shielding layer that is disposed on the first substrate so as to overlap with the semiconductor layer in a plan view and is set to the same potential as the potential of the gate electrode; a first insulating layer disposed so as to cover the first light shielding layer; a second light shielding layer that is disposed on the first insulating layer so as to overlap with the semiconductor layer and the first light shielding layer in a plan view and is set to the same potential as the potential of the gate electrode; and a second insulating layer disposed so as to cover the second light shielding layer, in which the first light shielding layer, the first insulating layer, the second light shielding layer, and the second insulating layer are provided between the first substrate and the semiconductor layer.

In this application example, the first light shielding layer, the first insulating layer, the second light shielding layer, and the second insulating layer are disposed between the first substrate and the semiconductor layer. Therefore, light incident from the first substrate side toward the semiconductor layer side is reflected at the interface between the first substrate and the first light shielding layer, and then reflected at the interface between the first insulating layer and the second light shielding layer. Thus, it is possible to effectively shield light incident from the first substrate side to the semiconductor layer. In addition, the potentials of the first light shielding layer and the second light shielding layer are set to the same potential as that of the gate electrode, and thus it is possible to configure the scanning line using the two layers of light shielding layer. In a case where the gate wiring is disposed in the same layer as that of the gate electrode, it is possible to configure the scanning line using the three layers including the two layers of the light shielding layer, thereby decreasing the wiring resistance of the scanning line. As a result, it is possible to decrease the wiring resistance of the scanning line while improving the light shielding properties compared to the related art, thereby providing the liquid crystal device having a high liquid crystal quality.

Application Example 7

In the liquid crystal device according to the application example, it is preferable that the first light shielding layer and the second light shielding layer are formed straddling the boundary between the pixels.

In this application example, the first light shielding layer and the second light shielding layer that constitute the scanning line are formed straddling the boundary between the pixels, and thus, even in a case where the liquid crystal device is a large liquid crystal device including the scanning line with a long length liquid crystal device, it is possible to decrease the wiring resistance of the scanning line while improving the light shielding property.

Application Example 8

In the liquid crystal device according to the application example, the first light shielding layer or the second light shielding layer may be formed to be separated for each pixel.

In a case where the size of the liquid crystal device is not large and decreasing the wiring resistance of the scanning line is not important, any one of the light shielding layers may be separated for each pixel.

Application Example 9

In the liquid crystal device according to the application example, it is preferable that a first contact hole and a second contact hole that penetrate the first insulating layer and electrically connect the first light shielding layer and the second light shielding layer, are further provided, and that the first contact hole and the second contact hole are disposed at both outsides of the semiconductor layer in a direction intersecting the extending direction of the semiconductor layer in a plan view.

In this application example, the pair of light shielding portions along the normal direction of the first substrate are formed between the first light shielding layer and the second light shielding layer by the contact holes penetrating the first insulating layer. The pair of light shielding portions are disposed at both outsides of the semiconductor layer in a plan view. Therefore, it is possible to shield light that is incident at an angle with respect to the normal direction of the first substrate from the first substrate side, and light reflected and propagated between the first light shielding layer and the second light shielding layer, from both outsides of the semiconductor layer, by the light shielding portions formed by the contact holes. Accordingly, it is possible to further improve the light shielding property.

Application Example 10

In the liquid crystal device according to the application example, it is preferable that the second light shielding layer is formed so as to fill the first contact hole and the second contact hole and has a substantially flat surface.

In this application example, the second light shielding layer having a substantially flat surface is formed on the first insulating layer by filling the pair of the contact holes penetrating the first insulating layer. Therefore, in a case of forming the contact holes for electrical connection from the upper layer side (gate electrode side) to the second light shielding layer, the positions at which the contact holes are disposed are not restricted, and thus it is possible to increase the degree of freedom in the wiring pattern design.

Application Example 11

In the liquid crystal device according to the application example, it is preferable that a third contact hole and a fourth contact hole that penetrate the gate insulating layer and the second insulating layer and electrically connect the gate electrode and the second light shielding layer are further provided, and that the third contact hole is disposed so as to overlap with the first contact hole in a plan view and the fourth contact hole is disposed so as to overlap with the second contact hole in a plan view.

In this application example, the pair of the contact holes that penetrate the first insulating layer and electrically connect the first light shielding layer and the second light shielding layer are disposed so as to overlap with the pair of the contact holes that penetrate the gate insulating layer and the second insulating layer and electrically connect the gate electrode and the second light shielding layer in a plan view. Therefore, it is possible to reduce the size of the region that is shielded by the contact holes, thereby improving the aperture ratio of the liquid crystal device. Further, the pair of light shielding portions along the normal direction of the first substrate are formed by the contact holes penetrating the gate insulating layer and the second insulating layer, and the pair of light shielding portions are disposed at both outsides of the semiconductor layer in a plan view. Thus, it is possible to further improve the light shielding property.

Application Example 12

In the liquid crystal device according to the application example, it is preferable that a fifth contact hole that penetrates the first insulating layer and electrically connects the first light shielding layer and the second light shielding layer, is further provided, and that, in the sectional view taken along the extending direction of the semiconductor layer, the second light shielding layer is disposed across the bottom portion and the side portions of the fifth contact hole, and the surface of the first insulating layer positioned at the outsides of the fifth contact hole, and that, in the sectional view taken along the extending direction of the semiconductor layer, the semiconductor layer is disposed so as to cover the second light shielding layer via the second insulating layer.

In this application example, in the sectional view taken along the extending direction of the semiconductor layer, the second light shielding layer is disposed across the bottom portion of the contact hole penetrating the first insulating layer, the side portions of the contact hole, and the surface of the first insulating layer at the outsides of the contact hole. The semiconductor layer is disposed so as to cover the second light shielding layer via the second insulating layer. Therefore, it is possible to make the substantial length of the semiconductor layer longer than the length of the semiconductor layer in a plan view. In other words, it is possible to make the length of the semiconductor layer in a plan view shorter than the length of the semiconductor layer that is required. Thus, it is possible to reduce the size of the light shielding region, thereby improving the aperture ratio of the liquid crystal device.

Application Example 13

In the liquid crystal device according to the application example, it is preferable that at least the channel region of the semiconductor layer is disposed at the bottom portion of the fifth contact hole.

In this application example, at least the channel region of the semiconductor layer is disposed on the bottom portion of the contact hole. Thus, even in a case where the size of the liquid crystal device is small, it is possible to ensure the channel length of the channel region. In a case where the LDD regions are disposed at both outsides of the channel region, it is possible to dispose the LDD regions in a region from the bottom portion to the outsides of the contact hole via the side portions of the contact hole. Thus, it is possible to ensure the LDD regions having a sufficient length. Therefore, it is possible to form the switching element with excellent operating characteristics. Further, the second light shielding layer that is disposed in the lower layer of the semiconductor layer is disposed so as to cover the bottom portion of the contact hole on which the channel region is disposed, the side portions of the contact hole, and the surface of the first insulating layer at the outsides of the contact hole. Thus, it is possible to effectively shield light incident to the channel region.

Application Example 14

In the liquid crystal device according to the application example, it is preferable that a third contact hole and a fourth contact hole that penetrate the gate insulating layer and the second insulating layer and electrically connect the gate electrode and the second light shielding layer, are further provided, and that the third contact hole and the fourth contact hole are disposed at both outsides of the semiconductor layer in a direction intersecting the extending direction of the semiconductor layer in a plan view.

In this application example, the pair of light shielding portions along the normal direction of the first substrate are formed by the contact holes penetrating the gate insulating layer and the second insulating layer. The pair of light shielding portions are disposed at both outsides of the semiconductor layer in a plan view. Therefore, it is possible to shield light that is incident at an angle with respect to the normal direction of the first substrate from the first substrate side, and light reflected and propagated between the gate electrode and the second light shielding layer, from both outsides of the semiconductor layer, by the light shielding portions formed by the contact holes. Accordingly, it is possible to further improve the light shielding property.

Application Example 15

In the liquid crystal device according to the application example, a plurality of contact holes that penetrate the first insulating layer and electrically connect the first light shielding layer and the second light shielding layer, may be further provided, and the number of the contact holes may be less than the number of the pixels.

In a case where the first light shielding layer and the second light shielding layer are formed straddling the boundary between the pixels, the number of the contact holes may be less than the number of the pixels.

Application Example 16

According to this application example, there is provided an electronic apparatus including the liquid crystal device described above.

In this application example, the liquid crystal device is provided, and thus it is possible to provide the electronic apparatus having an excellent display quality.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments embodying the invention will be described with reference to the accompanying drawings. The drawings used in the description are appropriately enlarged or reduced such that the parts to be described are in a recognizable state.

In the following embodiment, for example, when "on substrate" is described, it represents a case so as to be disposed in contact with the surface of the substrate, a case so as to be disposed on the substrate via other components, or a case so as to be disposed in partial contact with the surface of the substrate and disposed on the substrate via other components.

In this embodiment, as a liquid crystal device, an active matrix type liquid crystal device that includes a thin film transistor as a switching element of a pixel will be described as an example. The liquid crystal device may be preferably used, for example, as a light modulation element (liquid crystal light bulb) of a projection type display apparatus (liquid crystal projector).

First Embodiment

Configuration of Liquid Crystal Device

Figure 1:
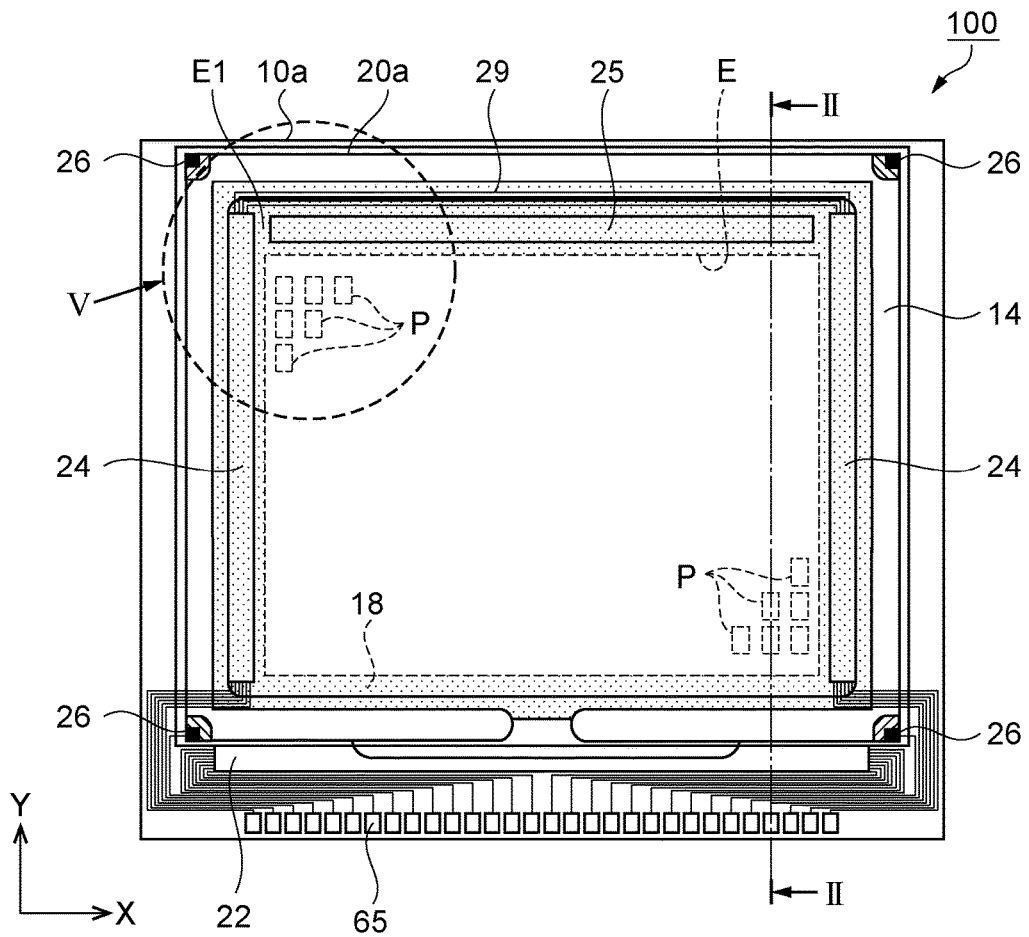
FIG. 1 is a schematic plan view illustrating the configuration of a liquid crystal device.
Figure 2:
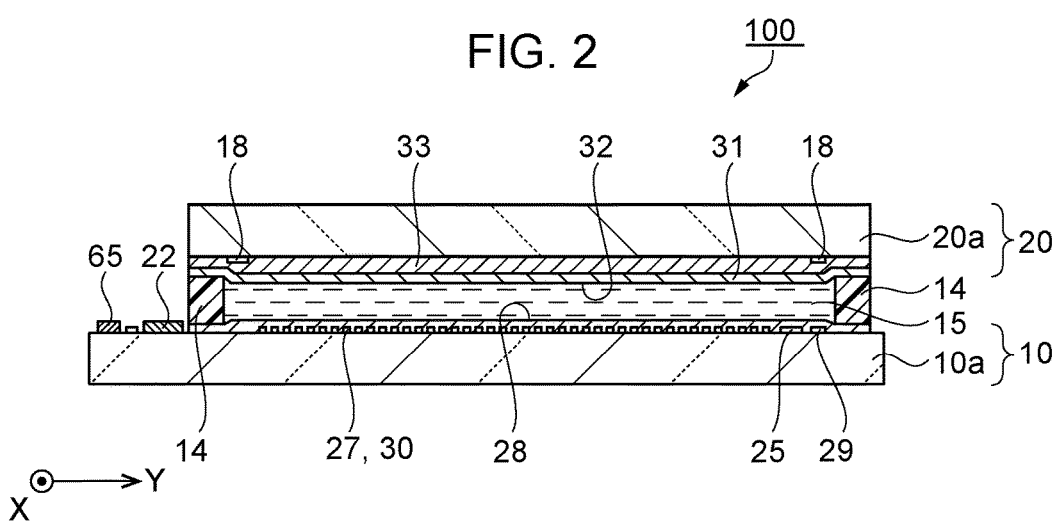
FIG. 2 is a schematic sectional view taken along line II-II of the liquid crystal device illustrated in FIG. 1.
Figure 3:
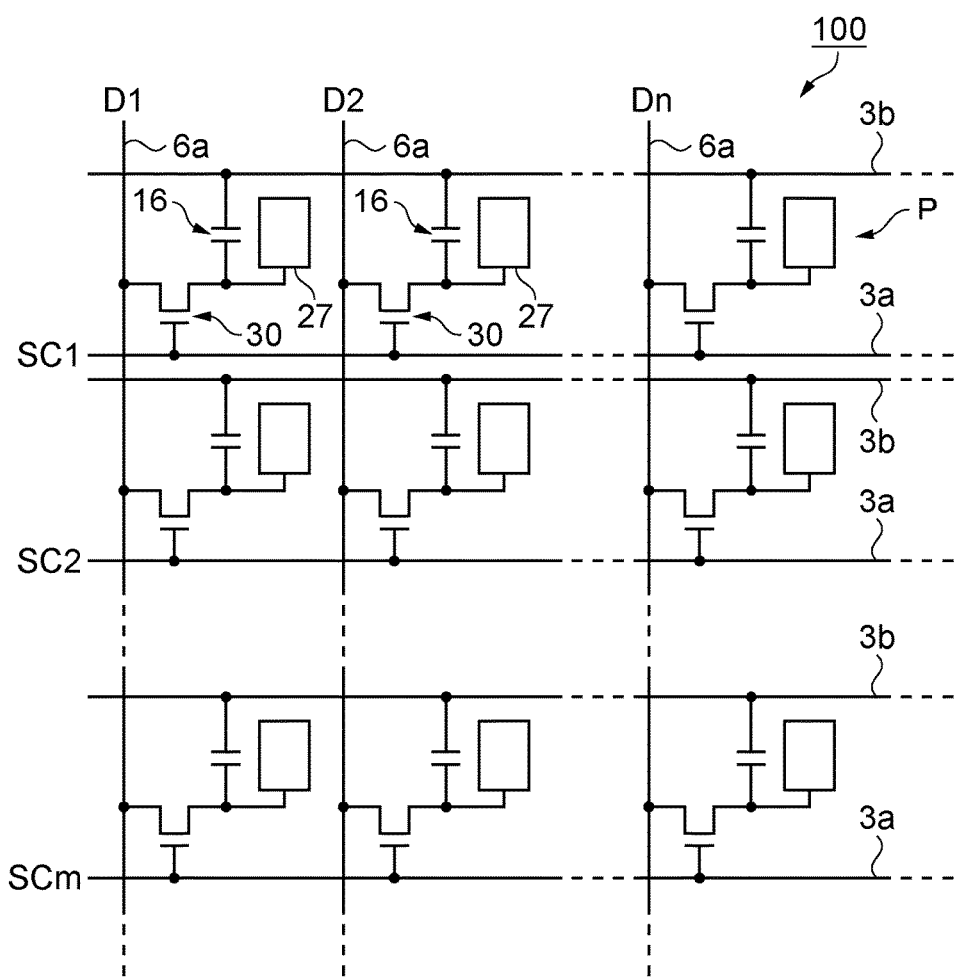
FIG. 3 is an equivalent circuit diagram illustrating the electrical configuration of the liquid crystal device.

FIG. 1 is a schematic plan view illustrating the configuration of the liquid crystal device. FIG. 2 is a schematic sectional view taken along a line II-II of the liquid crystal device illustrated in FIG. 1. FIG. 3 is an equivalent circuit diagram illustrating the electrical configuration of the liquid crystal device. Hereinafter, the configuration of the liquid crystal device will be described with reference to FIGS. 1 to 3.

As illustrated in FIGS. 1 and 2, the liquid crystal device 100 according to this embodiment includes an element substrate 10 and a counter substrate 20 that are disposed to be opposite to each other, and a liquid crystal layer 15 that is interposed by a pair of the substrates. As a first base material 10a (substrate) that constitutes the element substrate 10 and a second base material 20a that constitutes the counter substrate 20, for example, a transparent substrate such as a glass substrate or a quartz substrate is used.

The size of the element substrate 10 is larger than that of the counter substrate 20, and both of the substrates are bonded to each other via sealing members 14 disposed along the outer circumference of the counter substrate 20. The gap between the sealing members 14 is filled and sealed with liquid crystal having a positive or negative dielectric anisotropy, and thus the liquid crystal layer 15 is configured.

As the sealing member 14, for example, an adhesive such as thermosetting epoxy resin or ultraviolet-curable epoxy resin is employed. The sealing member 14 incorporates a spacer for maintaining the gap between the pair of substrates. The spacer is used to make a cell gap.

The display region E in which a plurality of pixels P that contributes to display are arranged is provided in the inside of the sealing member 14. A peripheral region E1 in which peripheral circuits or the like that do not contribute to display are provided is disposed around the display region E.

A data line driving circuit 22 is provided between the sealing member 14 along a first-direction side portion of the element substrate 10 and the first-direction side portion. An inspection circuit 25 is provided between the sealing member 14 along another first-direction side portion that is opposite to the first-direction side portion and the display region E. Scanning line driving circuits 24 are provided between the sealing members 14 along second-direction side portions that are perpendicular to the first-direction side portions and opposite to each other and the display region E. A plurality of wirings 29 connecting the two scanning line driving circuits 24 are provided between the sealing member 14 along another first-direction side portion that is opposite to the first-direction side portion and the inspection circuit 25.

A frame-shaped light shielding film 18 (parting portion) is provided in the inside of the sealing member 14 at the counter substrate 20 side that is disposed in a frame shape. For example, the light shielding film 18 is made of metal, metal oxide, or the like having a light reflection property, and the inside of the light shielding film 18 is the display region E that includes the plurality of pixels P. As the light shielding film 18, for example, tungsten silicide (WSi) may be used. Although not illustrated in FIG. 1, a light shielding film that partitions the plurality of pixels P in a plane is also provided in the display region E.

The wiring connected to the data line driving circuit 22 and the scanning line driving circuit 24 is connected to a plurality of external connection terminals 65 that are arranged along the first-direction side portion. Hereinafter, the direction along the first-direction side portion is described as an X-direction, and the direction along second-direction side portions that are perpendicular to the first-direction side portions and opposite to each other is described as a Y-direction.

As illustrated in FIG. 2, a transparent pixel electrode 27 and a thin film transistor as a switching element (hereafter, referred to as "transistor 30") that are provided for each pixel P, signal wiring (not illustrated), and a first alignment film 28 covering the transparent pixel electrode 27, the transistor 30, and the signal wiring is formed on the surface of the first base material 10a on the liquid crystal layer 15 side.

The light shielding configuration (not illustrated) that prevents a switching operation from being unstable due to light that is incident to the semiconductor layer of the transistor 30 is employed. The element substrate 10 of the invention includes at least the pixel electrode 27, the transistor 30, the signal wiring, and the first alignment film 28.

The light shielding film 18, an insulating layer 33 that is formed so as to cover the light shielding film 18, a counter electrode 31 that is provided to cover the insulating layer 33, and a second alignment film 32 that covers the counter electrode 31 are provided on the surface of the counter substrate 20 on the liquid crystal layer 15 side. The counter substrate 20 of the invention includes at least the light shielding film 18, the counter electrode 31, and the second alignment film 32.

As illustrated in FIG. 1, the light shielding film 18 surrounds the display region E, and is provided at the position overlapping with the scanning line driving circuit 24 and the inspection circuit 25 in a plane. Accordingly, the light shielding film 18 prevents the malfunction of the peripheral circuits including these driving circuits due to light, by shielding light that is incident to the peripheral circuits from the counter substrate 20 side. Further, the light shielding film 18 ensures high contrast in the display of the display region E by shielding unnecessary stray light so as not to be incident to the display region E.

The insulating layer 33 is made of, for example, an inorganic material such as silicon oxide, and has a light transmitting property. The insulating layer 33 is provided so as to cover the light shielding film 18. As the method of forming the insulating layer 33, for example, a method of forming a film using a plasma chemical vapor deposition (CVD) method or the like may be used.

The counter electrode 31 is made of, for example, a transparent conductive film such indium tin oxide (ITO), and covers the insulating layer 33. As illustrated in FIG. 1, the counter electrode 31 is electrically connected to the wiring on the element substrate 10 side by upper and lower conduction portions 26 provided at the four corners of the counter substrate 20.

The first alignment film 28 covering the pixel electrode 27 and the second alignment film 32 covering the counter electrode 31 are selected based on the optical design of the liquid crystal device 100. As the first alignment film 28 and the second alignment film 32, an inorganic alignment film obtained by forming a film with an inorganic material such as $SiO_x$ (silicon oxide) using a vapor growth method and aligning the film substantially perpendicular to the liquid crystal molecules having negative dielectric anisotropy may be used.

The liquid crystal device 100 is, for example, a transmission type, and adopts a normally white mode type optical design in which the transmittance of the pixel P when a voltage is not applied is greater than the transmittance when a voltage is applied, or a normally black mode type optical design in which the transmittance of the pixel P when a voltage is not applied is smaller than the transmittance when a voltage is applied. A polarization element is respectively disposed and used at the incident side and the emitting side of light according to the optical design.

As illustrated in FIG. 3, the liquid crystal device 100 includes at least a plurality of scanning lines 3a and a plurality of data lines 6a that are insulated from each other and perpendicular to each other in the display region E, and a plurality of capacitance lines 3b. For example, the direction to which the scanning lines 3a are extended is the X-direction, and the direction to which the data lines 6a are extended is the Y-direction.

The pixel circuit of the pixel P is configured with the scanning line 3a, the data line 6a, the capacitance line 3b, the pixel electrodes 27, the transistors 30, and capacitor elements 16 that are provided in the region divided by the signal lines.

The scanning line 3a is electrically connected to the gate of the transistor 30, and the data line 6a is electrically connected to the source-drain region on the data line side of the transistor 30. The pixel electrode 27 is electrically connected to the source-drain region on the pixel electrode side of the transistor 30.

The data line 6a is connected to the data line driving circuit 22 (refer to FIG. 1), and supplies the image signals D1, D2, . . . , Dn supplied from the data line driving circuit 22 to the pixel P. The scanning line 3a is connected to the scanning line driving circuit 24 (refer to FIG. 1), and supplies the scanning signals SC1, SC2, . . . , SCm supplied from the scanning line driving circuit 24 to each pixel P.

The image signals D1 to Dn supplied from the data line driving circuit 22 to the data line 6a may be line-sequentially supplied in this order, or may be supplied for each group with a plurality of data lines 6a adjacent to each other. The scanning line driving circuit 24 supplies the scanning signals SC1 to SCm to the scanning lines 3a in a line sequential manner using a pulse at a predetermined timing.

In the liquid crystal device 100, the transistor 30 as a switching element is turned on only for a certain period by the input of the scanning signals SC1 to SCm, and thus image signals D1 to Dn supplied from the data lines 6a are written to the pixel electrode 27 at a predetermined timing. The image signals D1 to Dn with a predetermined level that are written to the liquid crystal layer 15 via the pixel electrode 27 are held for a predetermined period between the pixel electrode 27 and the counter electrode 31 that are disposed to interpose the liquid crystal layer 15.

In order to prevent the held image signals D1 to Dn from leaking, the capacitor element 16 is connected in parallel to a liquid crystal capacitor formed between the pixel electrode 27 and the counter electrode 31. The capacitor element 16 is provided between the source-drain region of the transistor 30 on the pixel electrode side and the capacitance line 3b. The capacitor element 16 is an element that includes a dielectric layer between two capacitor electrodes.

Configuration of Pixel Constituting Liquid Crystal Device

Figure 4:
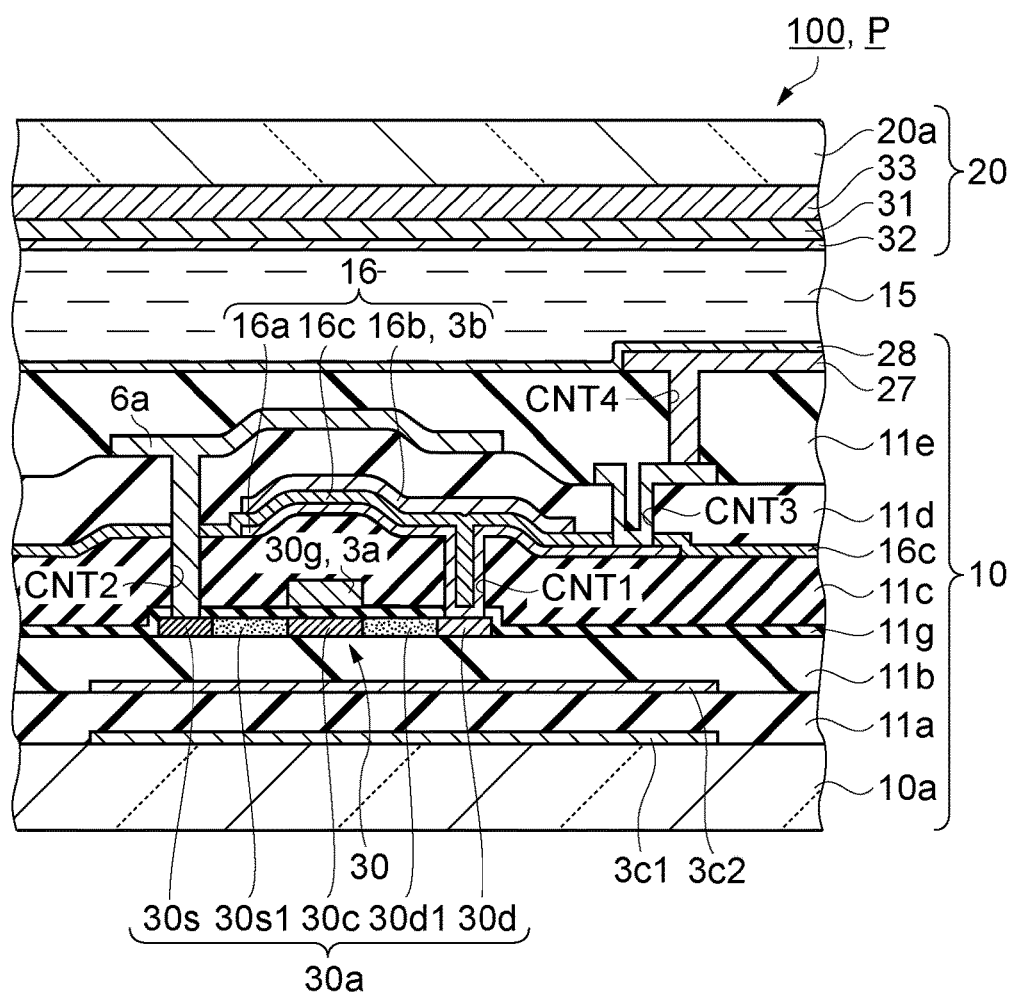
FIG. 4 is a schematic sectional view mainly illustrating the configuration of the pixel of the liquid crystal device.

Next, the configuration of the pixel will be described with reference to FIG. 4. FIG. 4 is a schematic sectional view mainly illustrating the configuration of the pixel of the liquid crystal device. FIG. 4 illustrates the sectional position relationship of each component in a clearly displayable scale.

As illustrated in FIG. 4, the pixel P of the liquid crystal device 100 includes the element substrate 10, and the counter substrate 20 disposed opposite to the element substrate. The first base material 10a constituting the element substrate 10 is, for example, a quartz substrate.

As illustrated in FIG. 4, a first light shielding layer 3c1 that is made of, for example, tungsten silicide (WSi) is disposed on the first base material 10a. The first light shielding layer 3c1 is patterned in a plane lattice shape, and defines the opening region of each pixel P.

A first insulating layer 11a that is made of silicon oxide is formed on the first light shielding layer 3c1 and the first base material 10a. A second light shielding layer 3c2 that is made of, for example, tungsten silicide (WSi) having a light reflection property is formed on the first insulating layer 11a, so as to overlap with a partial region of a semiconductor layer 30a in a plan view. A second insulating layer 11b that is made of silicon oxide or the like is formed on the second light shielding layer 3c2 and the first insulating layer 11a.

The transistor 30, the scanning line 3a, and the like are formed on the second insulating layer 11b. The transistor 30 has, for example, a Lightly Doped Drain (LDD) structure, and includes the semiconductor layer 30a that is made of polysilicon (polycrystalline silicon having high purity), a gate insulating layer 11g formed on the semiconductor layer 30a, and a gate electrode 30g that is made of polysilicon film or the like and formed on the gate insulating layer 11g. The scanning line 3a also functions as the gate electrode 30g.

The semiconductor layer 30a is formed as the N-type transistor 30 by, for example, being implanted with N-type impurity ions such as phosphorus (P) ions. Specifically, the semiconductor layer 30a includes a channel region 30c, a data line side LDD region 30s1, a data line side source-drain region 30s, a pixel electrode side LDD region 30d1, and a pixel electrode side source-drain region 30d.

The channel region 30c is doped with P-type impurity ions such as boron (B) ions. The other regions (30s1, 30s, 30d1, 30d) are doped with N-type impurity ions such as phosphorus (P) ions. As described above, the transistor 30 is formed as an N-type transistor.

A third interlayer insulating layer 11c that is made of silicon oxide or the like is formed on the gate electrode 30g and the gate insulating layer 11g. The capacitor element 16 is provided on the third interlayer insulating layer 11c. Specifically, a first capacitor electrode 16a as a pixel potential side capacitor electrode that is electrically connected to the pixel electrode side source-drain region 30d of the transistor 30 and the pixel electrode 27 and a part of the capacitance line 3b (second capacitor electrode 16b) as a fixed potential side capacitor electrode are disposed opposite to each other via a dielectric film 16c, and thus the capacitor element 16 is formed.

The dielectric film 16c is, for example, a silicon nitride film. The second capacitor electrode 16b (capacitance line 3b) is made of, for example, a single metal, an alloy, a metal silicide, a polysilicide, or a material obtained by stacking the above-mentioned material that includes at least one of metals having a high melting point such as titanium (Ti), chromium (Cr), tungsten (W), tantalum (Ta), or molybdenum (Mo). Alternatively, the second capacitor electrode 16b may also be formed by an aluminum (Al) film.

The first capacitor electrode 16a functions as the pixel potential side capacitor electrode of the capacitor element 16 that is made of, for example, a conductive polysilicon film. Here, the first capacitor electrode 16a may be made of a single layer film or a multilayer film that includes a metal or an alloy, similarly to the capacitance line 3b. The first capacitor electrode 16a has a function of relaying and connecting the pixel electrode 27 and the pixel electrode side source-drain region 30d (drain region) of the transistor 30 via contact holes CNT1, CNT3, and CNT4, in addition to the function as the pixel potential side capacitor electrode.

The data line 6a is formed on the capacitor element 16 via a fourth interlayer insulating layer 11d. The data line 6a is electrically connected to the data line side source-drain region 30s (source region) of the semiconductor layer 30a via a gate insulating layer 11g, a third interlayer insulating layer 11c, the dielectric film 16c, and a contact hole CNT2 that is open in the fourth interlayer insulating layer 11d.

The pixel electrode 27 is formed above the data line 6a via a fifth interlayer insulating layer 11e. The fifth interlayer insulating layer 11e is made of, for example, silicon oxide or silicon nitride, and subjected to a planarization process for planarizing the protrusion portion of the surface that is caused by covering the region in which the transistor 30 is provided. As a method for the planarization process, a chemical mechanical polishing (CMP) process, a spin coating process, or the like may be used. The contact hole CNT4 is formed in the fifth interlayer insulating layer 11e.

The pixel electrode 27 is connected to the first capacitor electrode 16a via the contact holes CNT4 and CNT3, and thus the pixel electrode 27 is electrically connected to the pixel electrode side source-drain region 30d (drain region) of the semiconductor layer 30a. The pixel electrode 27 is formed, for example, by a transparent conductive film such as an ITO film.

A first alignment film 28 that is formed by obliquely vapor-depositing an inorganic material such as silicon oxide ($SiO_2$) is provided on the fifth interlayer insulating layer 11e between the pixel electrode 27 and the adjacent pixel electrode 27. A liquid crystal layer 15 that is filled and sealed with liquid crystal or the like in the space surrounded by the sealing member 14 is provided on the first alignment film 28.

On the other hand, the counter electrode 31 is provided, for example, on the entire surface of the insulating layer 33 (liquid crystal layer 15 side) of the counter substrate 20. A second alignment film 32 that is formed by obliquely vapor-depositing an inorganic material such as silicon oxide ($SiO_2$) is provided on the counter electrode 31. The counter electrode 31 is formed, for example, by a transparent conductive film such as an ITO film, similarly to the pixel electrode 27.

The liquid crystal layer 15 is in a predetermined alignment state by the alignment films 28 and 32 in a state where an electric field is not generated between the pixel electrode 27 and the counter electrode 31. The sealing member 14 is an adhesive for bonding the element substrate 10 and the counter substrate 20 that is made of a photocurable resin or a thermosetting resin, and the spacers such as glass fibers or glass beads for making the distance between the element substrate 10 and the counter substrate 20 with a predetermined value are mixed into the sealing member 14.

Light of a projector 1000 to be described later is incident, for example, from the back side of the liquid crystal device 100 (element substrate 10 side).

Configuration of Light Shielding Layer

Figure 5:
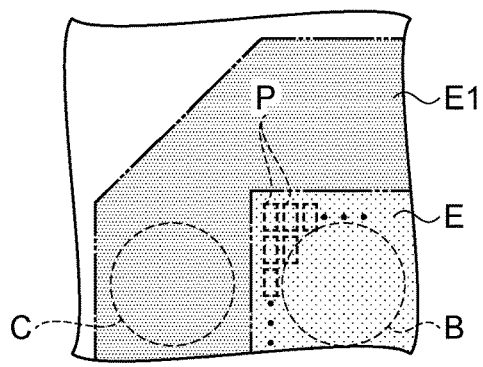
FIG. 5 is an enlarged plan view illustrating the enlarged V portion of the liquid crystal device in FIG. 1.
Figure 6:
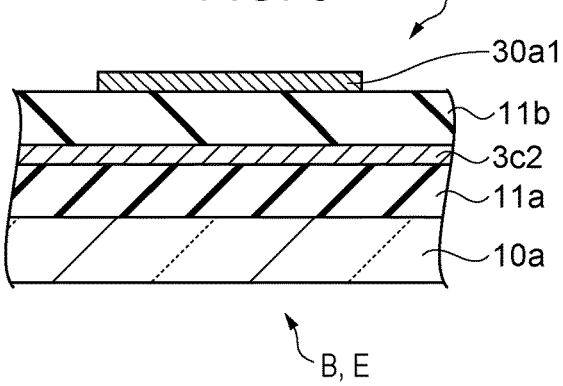
FIG. 6 is a schematic sectional view illustrating the configuration of a light shielding layer of a display region according to a first embodiment.
Figure 7:
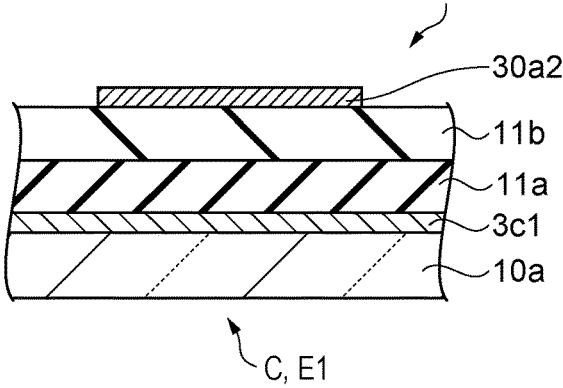
FIG. 7 is a schematic sectional view illustrating the configuration of the light shielding layer of a peripheral region.

Next, the configuration of the light shielding layer of the first embodiment will be described with reference to FIGS. 5 to 7. FIG. 5 is an enlarged plan view illustrating the enlarged V portion of the liquid crystal device in FIG. 1. FIG. 6 is a schematic sectional view illustrating the configuration of the light shielding layer (second light shielding layer) of the display region. FIG. 7 is a schematic sectional view illustrating the configuration of the light shielding layer (first light shielding layer) of the peripheral region.

As illustrated in FIG. 5, the liquid crystal device 100 includes the display region E in which the pixels P each of which includes a first transistor 301 are disposed, and the peripheral region E1 in which the peripheral circuits each of which includes a second transistor 302 are disposed.

As illustrated in FIG. 6, in the display region E, for example, the first insulating layer 11a, the second light shielding layer 3c2, the second insulating layer 11b, and the semiconductor layer 30a1 are stacked in this order from the first base material 10a side. The second light shielding layer 3c2 is disposed so as to overlap with the semiconductor layer 30a1 in a plan view. Specifically, the second light shielding layer 3c2 is disposed so as to overlap with at least the LDD region of the semiconductor layer 30a1 in a plan view.

As illustrated in FIG. 7, in the peripheral region E1, for example, the first light shielding layer 3c1, the first insulating layer 11a, the second insulating layer 11b, and the semiconductor layer 30a2 are stacked in this order from the first base material 10a side. The first light shielding layer 3c1 is disposed so as to overlap with the semiconductor layer 30a2 in a plan view. Specifically, the first light shielding layer 3c1 is disposed so as to overlap with at least the LDD region of the semiconductor layer 30a2 in a plan view.

As the material of the first light shielding layer 3c1 and the second light shielding layer 3c2, a material having light shielding properties or light reflection properties may be used. For example, tungsten silicide (WSi) having a light reflection property may be used, similarly to the light shielding film 18. As described above, tungsten silicide is used, and thus it is possible to prevent the heat being applied to the transistor.

The second light shielding layer 3c2 provided in the display region E is disposed so as to overlap with the first transistor 301 in a plan view, and can shield light at the position closer than the layer of the first light shielding layer 3c1. Thus, in a projector or the like, it is possible to improve the light shielding properties in the light transmission region in which light is transmitted.

The first light shielding layer 3c1 provided in the peripheral region E1 is disposed so as to overlap with the second transistor 302 in a plan view. Thus, the first light shielding layer 3c1 can shield light leaked from the outside. Therefore, it is possible to prevent a change in characteristics of the transistor, for example.

The thickness of the first light shielding layer 3c1 is equal to or greater than 200 nm, for example. The thickness of the second light shielding layer 3c2 is equal to or greater than 100 nm, for example. The thickness of the first insulating layer 11a is, for example, 2000 Å. The thickness of the second insulating layer 11b is, for example, 2000 Å.

Configuration of Electronic Apparatus

Figure 8:
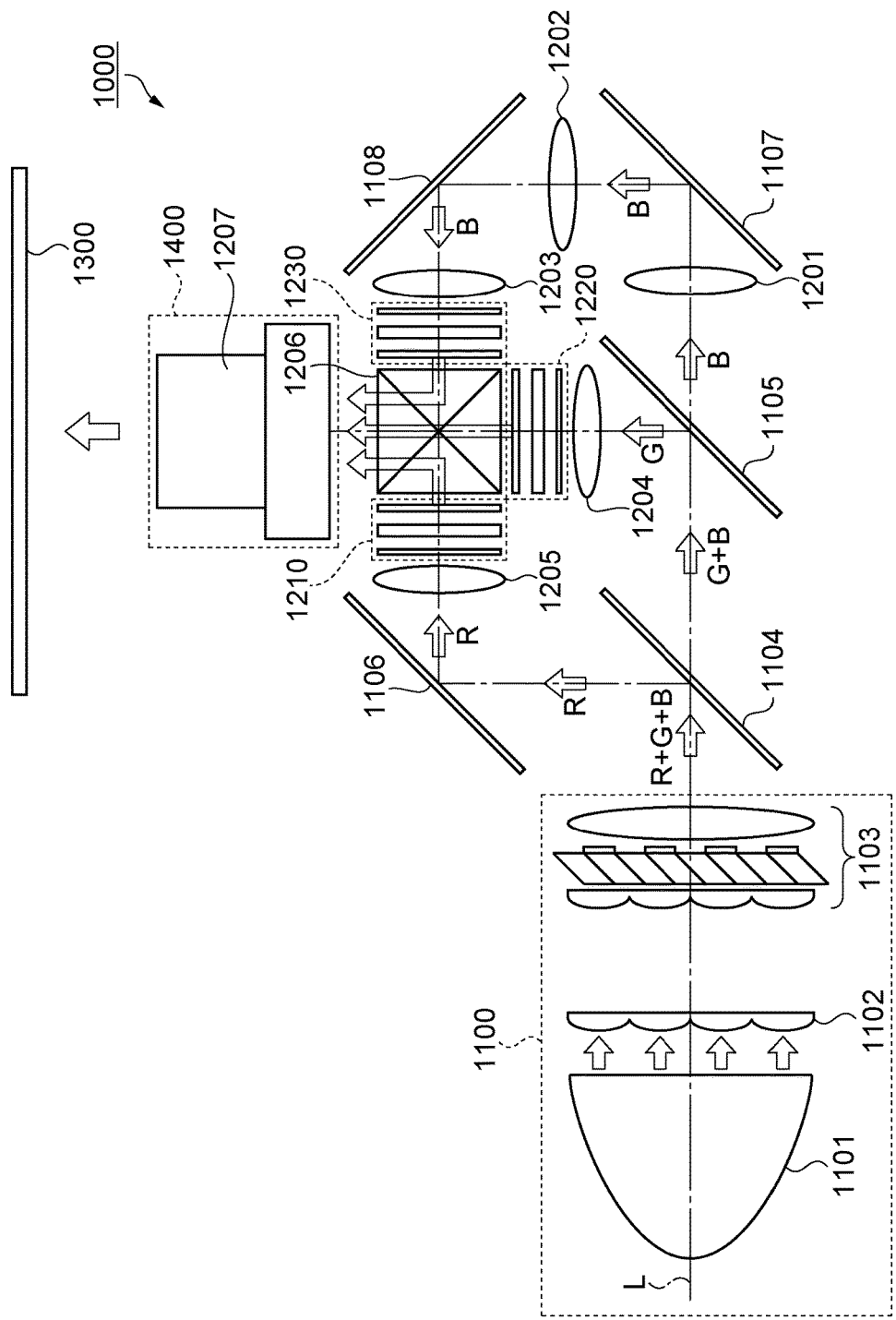
FIG. 8 is a schematic diagram illustrating the configuration of a projector as an electronic apparatus.

FIG. 8 is a schematic diagram illustrating the configuration of the projector as an electronic apparatus. Hereinafter, the configuration of the projector will be described with reference to FIG. 8.

As illustrated in FIG. 8, the projector 1000 according to this embodiment includes a polarization illumination device 1100 as an illumination system disposed along the system optical axis L, two dichroic mirrors 1104 and 1105 as a light separation element, three reflection mirrors 1106, 1107, and 1108, five relay lenses 1201, 1202, 1203, 1204, and 1205, three transmission type liquid crystal light bulbs 1210, 1220, and 1230 as light modulation means, a cross dichroic prism 1206 as a light synthesizing element, and a projection lens 1207.

The polarization illumination device 1100 is schematically configured with a lamp unit 1101 as a light source that is configured by a white light source such as an ultra-high pressure mercury lamp or a halogen lamp, an integrator lens 1102, and a polarization conversion element 1103.

The dichroic mirror 1104 reflects red light (R) among polarized light beams emitted from the polarization illumination device 1100, and transmits green light (G) and blue light (B). Another dichroic mirror 1105 reflects the green light (G) transmitted through the dichroic mirror 1104, and transmits the blue light (B).

The red light (R) reflected by the dichroic mirror 1104 is reflected by the reflection mirror 1106, and then is incident to the liquid crystal light bulb 1210 via the relay lens 1205. The green light (G) reflected by the dichroic mirror 1105 is incident to the liquid crystal light bulb 1220 via the relay lens 1204. The blue light (B) transmitted through the dichroic mirror 1105 is incident to the liquid crystal light bulb 1230 via a light guide system that is configured by three relay lenses 1201, 1202, and 1203 and two reflection mirrors 1107 and 1108.

The liquid crystal light bulbs 1210, 1220, and 1230 are respectively disposed opposite to the incidence plane of each color light of the cross dichroic prism 1206. Each color light incident to the liquid crystal light bulbs 1210, 1220, and 1230 is modulated based on video information (video signal), and emitted toward the cross dichroic prism 1206.

The prism is formed by bonding four right-angle prisms. In the inner surface of the prism, a dielectric multilayer film that reflects the red light and a dielectric multilayer film that reflects the blue light are formed in a cross shape. Three color light beams are synthesized by the dielectric multilayer films, and thus light beams representing a color image are synthesized. Light beams that are synthesized are projected on a screen 1300 by the projection lens 1207 that constitutes a projection optical system 1400, and thus the image is enlarged and displayed.

The liquid crystal device 100 to be described later is applied to the liquid crystal light bulb 1210. The liquid crystal device 100 is disposed with a gap between a pair of polarization elements that are disposed in a crossed nicol state at the incident side and the emitting side of the color light. The other liquid crystal light bulbs 1220 and 1230 are similar to the liquid crystal light bulb 1210.

The electronic apparatus with the above-described configuration uses the liquid crystal device 100 according to the embodiment described above, and thus it is possible to provide the projector 1000 having high reliability and excellent display characteristics.

As the electronic apparatus in which the liquid crystal device 100 is mounted, for example, various electronic apparatuses such as a head-mounted display (HMD), a head-up display (HUD), a smart phone, an electronic view finder (EVF), a mobile phone, a mobile computer, a digital camera, a digital video camera, an in-vehicle apparatus, or an illumination apparatus can be used, in addition to the projector 1000.

As described above, according to the liquid crystal device 100 and the electronic apparatus of the first embodiment, the following effects can be obtained.

(1) According to the liquid crystal device 100 of the first embodiment, the first transistor 301 of the pixel P disposed in the display region E is overlapped with the second light shielding layer 3c2 in a plan view, and thus it is possible to shield the first transistor 301 from light even in a case where light is incident to the display region E from the projector 1000. On the other hand, the second transistor 302 of the peripheral circuit disposed in the peripheral region E1 is overlapped with the first light shielding layer 3c1 in a plan view, and thus it is possible to shield light even in a case where light that is leaked from the outside is incident to the peripheral region. Therefore, it is possible to shield light without causing failure characteristics of the peripheral circuit. In addition, the second light shielding layer 3c2 is disposed in the layer closer to the first transistor 301 than the first light shielding layer 3c1, and thus it is possible to further prevent light from being incident to the first transistor 301 in the light transmission region. Further, it is possible to shield light at the position close to the first transistor 301, thereby improving the light shielding properties of light that is incident at an angle.

(2) According to the liquid crystal device 100 of the first embodiment, tungsten silicide having a light reflection property is used in the first light shielding layer 3c1 and the second light shielding layer 3c2, and thus it is possible to prevent the first transistor 301 and the second transistor 302 (further, liquid crystal device 100) from heating.

(3) According to the electronic apparatus of the first embodiment, the liquid crystal device 100 is provided, and thus it is possible to provide the electronic apparatus having an excellent display quality.

Second Embodiment

Configuration of Light Shielding Layer

Figure 9:
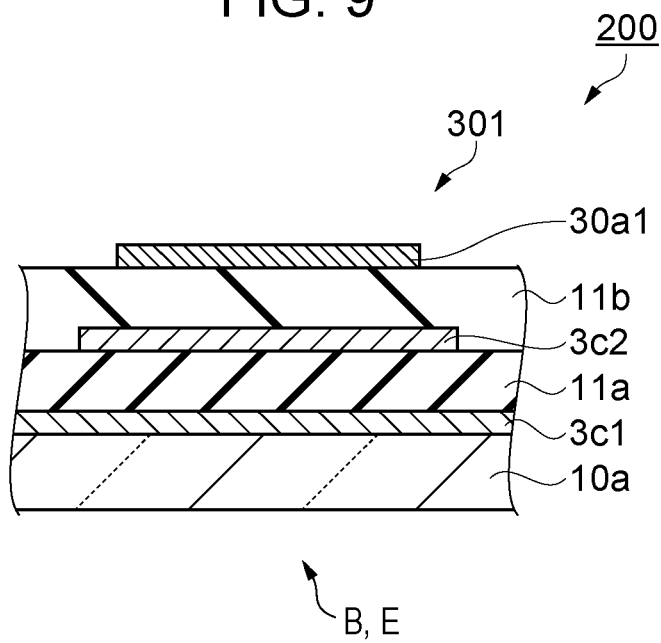
FIG. 9 is a schematic sectional view illustrating the configuration of a light shielding layer of a display region according to a second embodiment.
Figure 10:
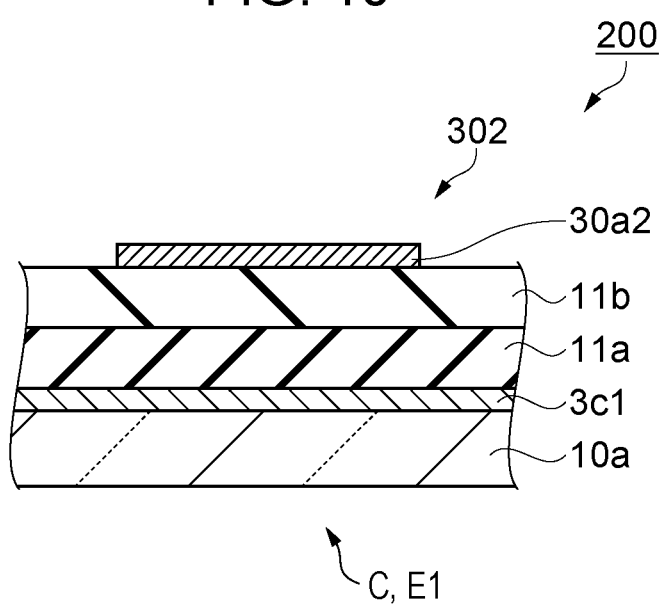
FIG. 10 is a schematic sectional view illustrating the configuration of the light shielding layer of a peripheral region.

Next, the configuration of the light shielding layer according to the second embodiment will be described with reference to FIGS. 9 and 10. FIG. 9 is a schematic sectional view illustrating the configuration of the light shielding layer of the display region. FIG. 10 is a schematic sectional view illustrating the configuration of the light shielding layer of the peripheral region.

The liquid crystal device 200 according to the second embodiment is mainly similar to the liquid crystal device 100 according to the first embodiment, except that the two layers of the first light shielding layer 3c1 and the second light shielding layer 3c2 are disposed in the display region E. For this reason, in the second embodiment, the part different from the first embodiment will be described in detail, and the detailed description of the other parts overlapped with the first embodiment will be omitted.

As illustrated in FIG. 9, in the display region E of the liquid crystal device 200 according to the second embodiment, the first light shielding layer 3c1, the first insulating layer 11a, the second light shielding layer 3c2, the second insulating layer 11b, and the semiconductor layer 30a1 are stacked in this order from the first base material 10a side. The first light shielding layer 3c1 and the second light shielding layer 3c2 are disposed so as to overlap with the semiconductor layer 30a1 in a plan view. Specifically, the first light shielding layer 3c1 and the second light shielding layer 3c2 are disposed so as to overlap with at least the LDD region of the semiconductor layer 30a1 in a plan view.

As illustrated in FIG. 10, in the peripheral region E1, as in the first embodiment, the first light shielding layer 3c1, the first insulating layer 11a, the second insulating layer 11b, and the semiconductor layer 30a2 are stacked in this order from the first base material 10a side. The first light shielding layer 3c1 is disposed so as to overlap with the semiconductor layer 30a2 in a plan view. Specifically, the first light shielding layer 3c1 is disposed so as to overlap with at least the LDD region of the semiconductor layer 30a2 in a plan view.

The first transistor 301 of the display region E is disposed so as to overlap with the first light shielding layer 3c1 and the second light shielding layer 3c2 in a plan view, and thus it is possible to improve the light shielding property, compared to a case where the first transistor is disposed so as to overlap with only the second light shielding layer 3c2. In particular, it is possible to significantly improve the light shielding properties in the light transmission region.

The first light shielding layer 3c1 provided in the peripheral region E1 is disposed so as to overlap with the second transistor 302 in a plan view, as in the first embodiment. Thus, the first light shielding layer 3c1 can shield light leaked from the outside. Therefore, it is possible to prevent a change in characteristics of the transistor, for example.

As described above in detail, according to the liquid crystal device 200 of the second embodiment, the following effects can be obtained, in addition to the effects according to the first embodiment.

(4) According to the liquid crystal device 200 of the second embodiment, in the display region E, the first transistor 301 is disposed so as to overlap with the two layers of the first light shielding layer 3c1 and the second light shielding layer 3c2 in a plan view, and thus it is possible to prevent light of the projector 1000 from being incident to the first transistor 301, thereby improving the light shielding property.

Third Embodiment

Configuration of Light Shielding Layer

Figure 11:
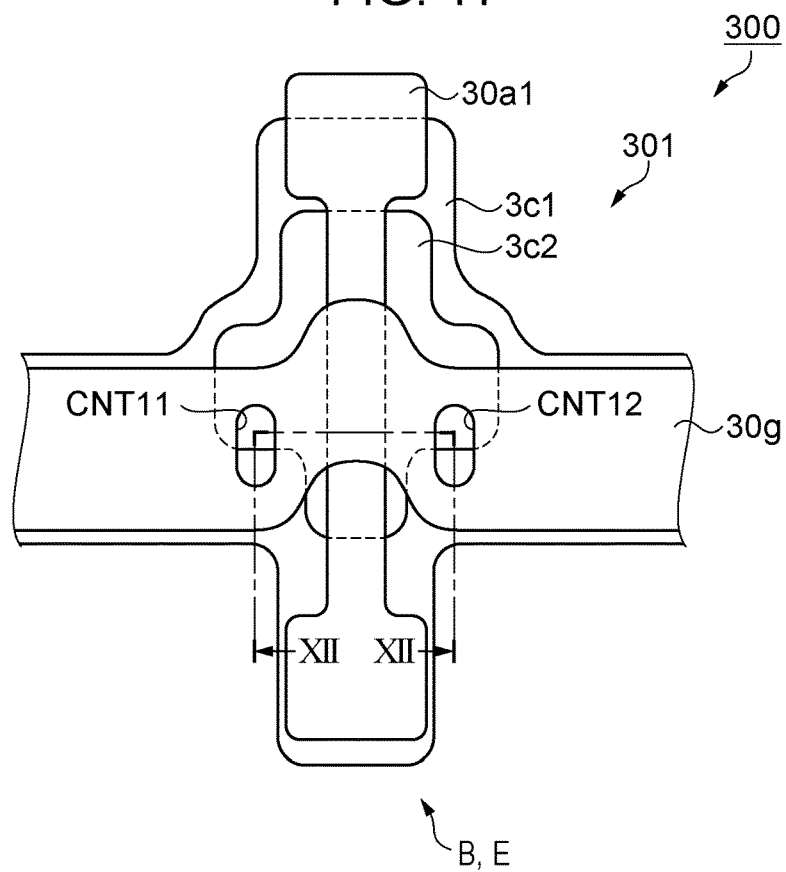
FIG. 11 is a schematic plan view illustrating the configurations of a light shielding layer and a first transistor of a display region according to a third embodiment.
Figure 12:
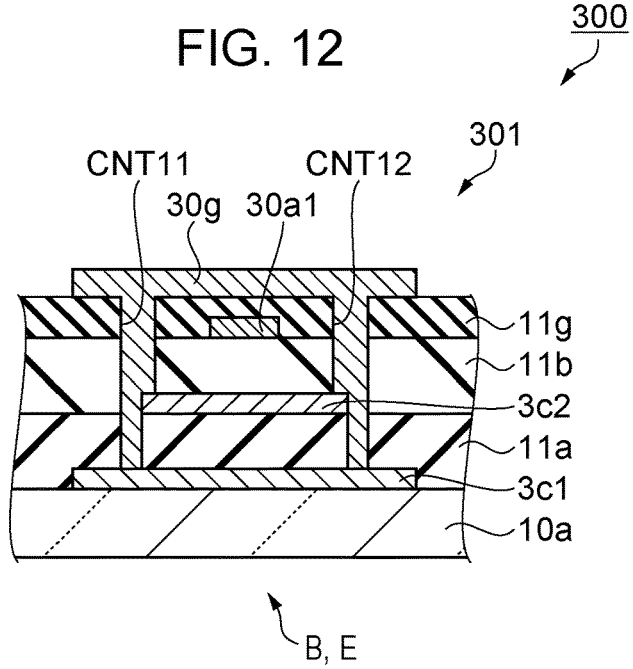
FIG. 12 is a schematic sectional view illustrating the configurations of the light shielding layer and the first transistor of the display region.

Next, the configuration of the light shielding layer according to the third embodiment will be described with reference to FIGS. 11 and 12. FIG. 11 is a schematic plan view illustrating the configurations of the light shielding layer and the first transistor of the display region. FIG. 12 is a schematic sectional view illustrating the configurations of the light shielding layer and the first transistor of the display region.

The liquid crystal device 300 according to the third embodiment is mainly similar to the liquid crystal device 200 according to the second embodiment, except that the two layers of the first light shielding layer 3c1 and the second light shielding layer 3c2 are disposed in the display region E, and further that the first light shielding layer 3c1 and the second light shielding layer 3c2 are electrically connected to the gate electrode 30g. For this reason, in the third embodiment, the part different from the second embodiment will be described in detail, and the description of the other parts overlapped with the second embodiment will be omitted.

As illustrated in FIGS. 11 and 12, in the display region E of the liquid crystal device 300 according to the third embodiment, as in the second embodiment, the first light shielding layer 3c1, the first insulating layer 11a, the second light shielding layer 3c2, the second insulating layer 11b, and the semiconductor layer 30a1 are stacked in this order from the first base material 10a side. The gate electrode 30g is disposed on the semiconductor layer 30a1 via the gate insulating layer 11g.

The first light shielding layer 3c1 and the second light shielding layer 3c2 are electrically connected to the gate electrode 30g via a contact hole CNT11. The first light shielding layer 3c1 and the second light shielding layer 3c2 are electrically connected to the gate electrode 30g via a contact hole CNT12.

The configuration of the peripheral region E1 is the same as that of the peripheral region E1 in the first embodiment and the second embodiment.

In the first transistor 301 of the display region E, the first light shielding layer 3c1 and the second light shielding layer 3c2, and the gate electrode 30g are electrically connected to each other, and thus the potentials of the first light shielding layer 3c1 and the second light shielding layer 3c2 are the same as that of the gate electrode, thereby improving the characteristics of the transistor.

In addition, the first light shielding layer 3c1 and the second light shielding layer 3c2 can electrically connected to the gate electrode 30g by using the one contact hole CNT11 (or CNT12), and thus it is possible to prevent a planar region from spreading, thereby maintaining an aperture ratio. Further, it is effective in narrowing the pitch between the pixels.

As described above, according to the liquid crystal device 300 of the third embodiment, the following effects can be obtained, in addition to the effects of the embodiments described above.

(5) According to the liquid crystal device 300 of the third embodiment, the first light shielding layer 3c1 and the second light shielding layer 3c2 are electrically connected to the gate electrode 30g, and thus it is possible to prevent a change in characteristics of the transistor such as a potential change or a floating. Further, the first light shielding layer 3c1 and the second light shielding layer 3c2 are electrically connected to the gate electrode 30g by using the one contact hole CNT11 (or CNT12), and thus it is possible to prevent a significant decrease in the aperture ratio. In addition, even in a case where the pitch between the pixels is narrowed, it is possible to effectively correspond to the case. Furthermore, it is unlikely to be restricted in layout.

Fourth Embodiment

Liquid Crystal Device

Here, an active matrix type liquid crystal device that includes a thin film transistors (TFT) as a switching element of the pixel will be described as an example. The liquid crystal device can be preferably used, for example, as a light modulation element (liquid crystal light bulb) of a projection type display apparatus (projector) to be described later.

Figure 13:
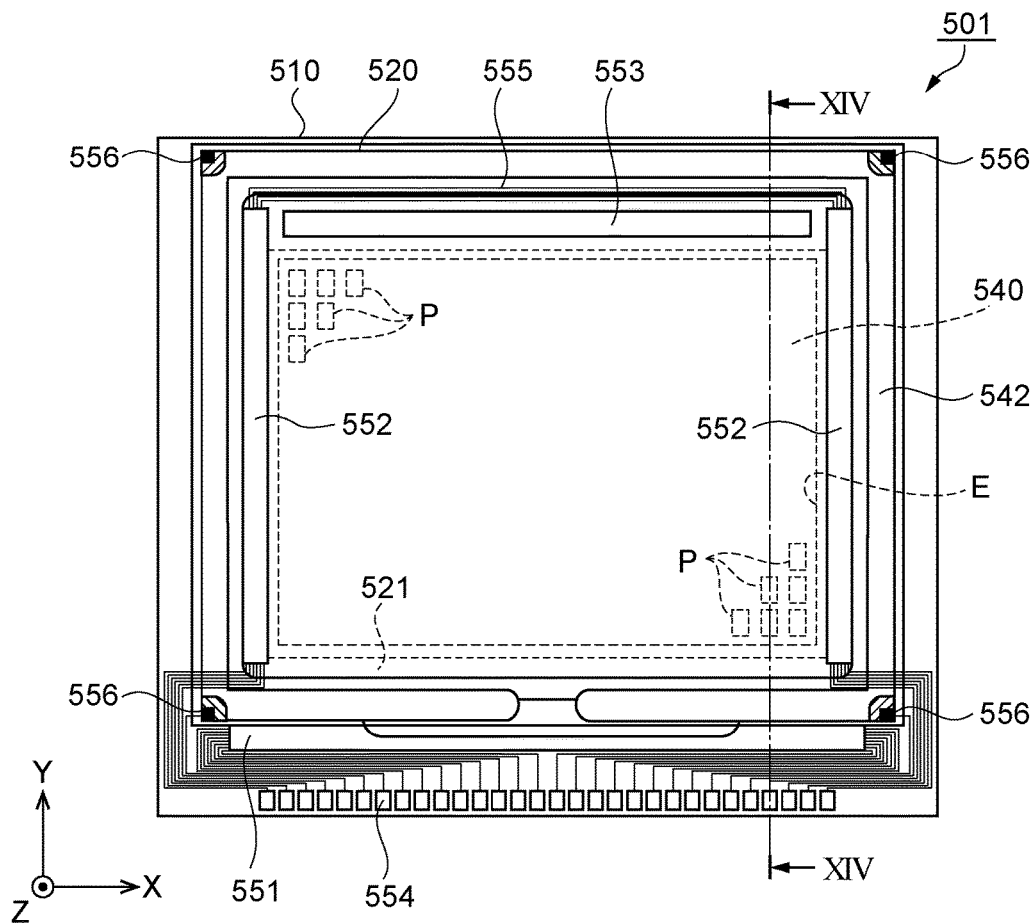
FIG. 13 is a schematic plan view illustrating the configuration of a liquid crystal device according to a fourth embodiment.
Figure 14:
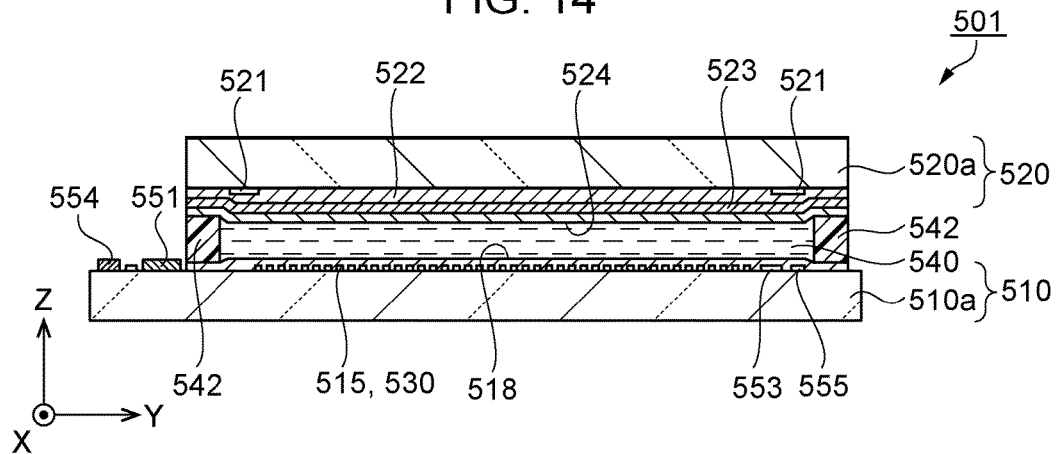
FIG. 14 is a schematic sectional view taken along line XIV-XIV in FIG. 13.
Figure 15:
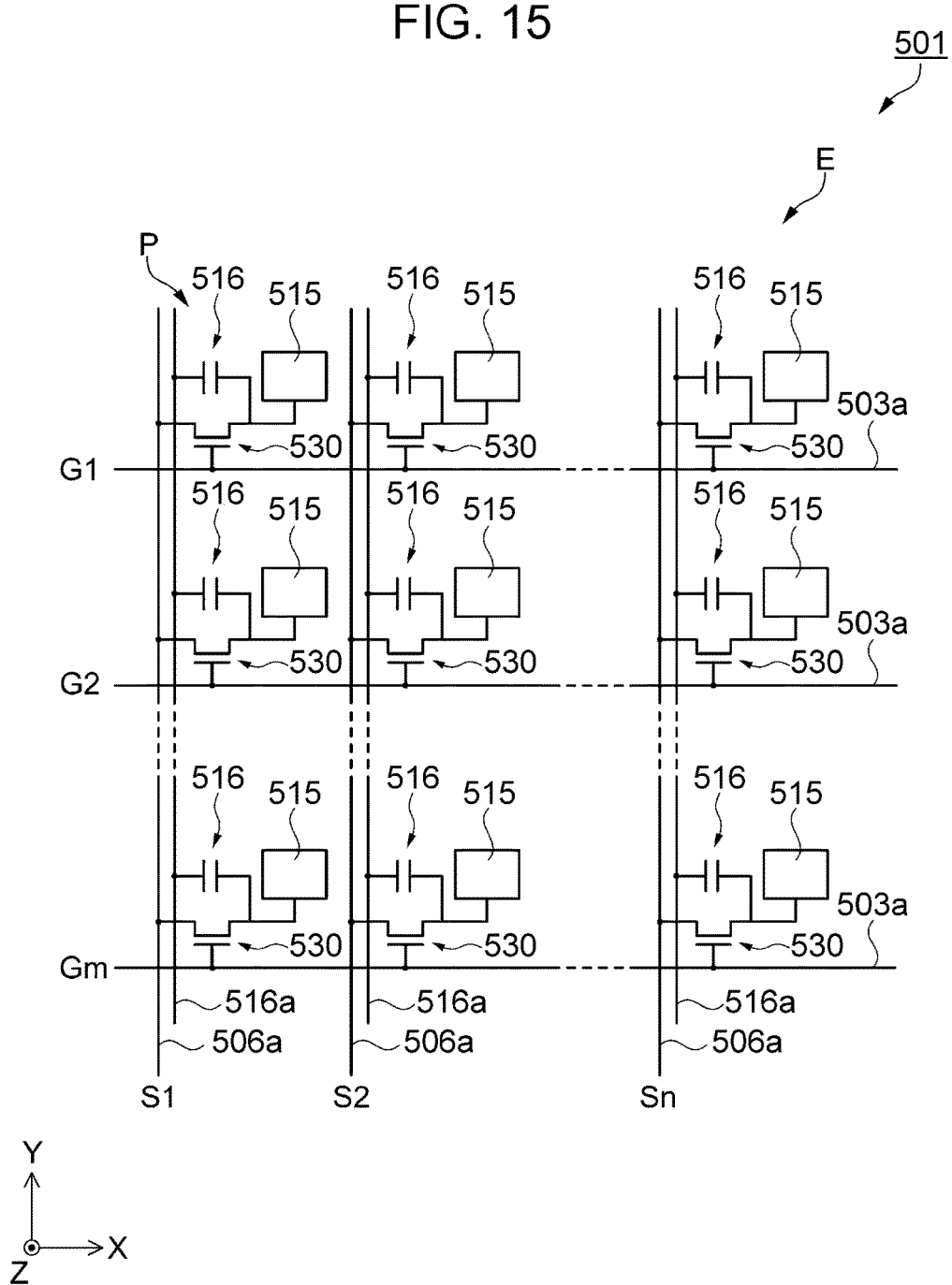
FIG. 15 is an equivalent circuit diagram illustrating the electrical configuration of the liquid crystal device according to the fourth embodiment.

First, the liquid crystal device as a display apparatus according to the fourth embodiment will be described with reference to FIGS. 13 and 14. FIG. 13 is a schematic plan view illustrating the configuration of the liquid crystal device according to the fourth embodiment. FIG. 14 is a schematic sectional view taken along line XIV-XIV in FIG. 13. FIG. 15 is an equivalent circuit diagram illustrating the electrical configuration of the liquid crystal device according to the fourth embodiment.

As illustrated in FIGS. 13 and 14, the liquid crystal device 501 according to the fourth embodiment includes an element substrate 510, a counter substrate 520 disposed opposite to the element substrate 510, and a liquid crystal layer 540 disposed between the element substrate 510 and the counter substrate 520. As the substrate 510a as a first substrate that constitutes the element substrate 510 and the substrate 520a as a second substrate that constitutes the counter substrate 520, for example, the substrate that is made of a material having a light transmitting property such as glass or quartz can be used.

The size of the element substrate 510 is further larger than that of the counter substrate 520, and the two substrates are bonded to each other via sealing members 542 disposed in a frame shape. The space surrounded by the element substrate 510, the counter substrate 520, and the sealing members 542 is filled and sealed with liquid crystal having a positive or negative dielectric anisotropy, and thus the liquid crystal layer 540 is configured.

The sealing member 542 is made of, for example, an adhesive such as thermosetting epoxy resin or ultraviolet-curable epoxy resin. The spacers (not illustrated) for maintaining the gap between the element substrate 510 and the counter substrate 520 with a constant value are mixed into the sealing member 542. A frame-shaped light shielding layer 521 provided on the counter substrate 520 is disposed in the inside of the sealing member 542 disposed in a frame shape. The light shielding layer 521 is made of, for example, metal or metal oxide having a light shielding property.

The inside of the light shielding layer 521 becomes the display region E in which a plurality of pixels P are arrayed. In the liquid crystal device 501, the display region E is a region that substantially contributes to display. Although not illustrated in FIGS. 13 and 14, even in the display region E, a lattice-shaped light shielding portion for partitioning the plurality of pixels P in a plane is provided, for example, on the counter substrate 520.

The data line driving circuit 551 and the plurality of external connection terminals 554 are provided at the outside of the sealing member 542 on a first-direction side portion of the element substrate 510 along the first-direction side portion. The inspection circuit 553 is provided in the inside of the sealing member 542 along another first-direction side portion that is opposite to the first-direction side portion. The scanning line driving circuits 552 are provided in the inside of the sealing members 542 along second-direction side portions that are perpendicular to the first-direction side portions and opposite to each other.

A plurality of wirings 555 connecting the two scanning line driving circuits 552 are provided in the inside of the sealing member 542 on the first-direction side portion at which the inspection circuit 553 is provided. The wirings connected to the data line driving circuit 551 and the scanning line driving circuit 552 are connected to the plurality of external connection terminals 554. The upper and lower conduction portions 556 for electrical conduction between the element substrate 510 and the counter substrate 520 are provided at the corner portions of the counter substrate 520. The disposition of the inspection circuit 553 is not limited thereto, and the inspection circuit 553 may be provided at the position along the inside of the sealing member 542 between the data line driving circuit 551 and the display region E.

In the following description, the direction along the first-direction side portion at which the data line driving circuit 551 is provided is described as an X-direction, and the direction along the second-direction side portions that are perpendicular to the first-direction side portions and opposite to each other is described as a Y-direction. The direction of the line XIV-XIV in FIG. 13 is a direction along the Y-direction. The direction that is perpendicular to the X-direction and the Y-direction and directed toward the upward in FIG. 14 is described as a Z-direction. In the specification, "in a plan view" denotes that it is seen from the normal direction (Z-direction) of the surface of the counter substrate 520 of the liquid crystal device 501.

As illustrated in FIG. 14, TFTs 530 (refer to FIG. 15) as a switching element provided for each pixel P, pixel electrodes 515 having a light transmitting property, signal lines (not illustrated), and an alignment film 518 covering the pixel electrodes 515 are provided on the surface of the substrate 510a on the liquid crystal layer 540 side. The pixel electrode 515 is made of a conductive film having a light transmitting property such as Indium Tin Oxide (ITO) or Indium Zinc Oxide (IZO).

In the element substrate 510 according to this embodiment, a light shielding configuration for preventing the switching operation from becoming unstable due to light incident to the semiconductor layer 530a (refer to FIG. 17) of the TFT 530 is adopted. The light shielding configuration will be described later.

The light shielding layer 521, an interlayer 522, a common electrode 523, and an alignment film 524 covering the common electrode 523 are provided on the liquid crystal layer 540 side of the counter substrate 520.

As illustrated in FIGS. 13 and 14, the frame-shaped light shielding layer 521 is provided at the position overlapping with the scanning line driving circuits 552, and the plurality of wirings 555 or the inspection circuit 553 in a plan view. The light shielding layer 521 shields light incident from the counter substrate 520 side, thereby preventing the malfunction of the peripheral circuit including the driving circuits due to light. The light shielding layer 521 ensures high contrast in the display of the display region E by shielding unnecessary stray light so as not to be incident to the display region E.

The interlayer 522 illustrated in FIG. 14 is formed to cover the light shielding layer 521. The interlayer 522 is formed of, for example, an insulating film such as silicon oxide ($SiO_2$), and has a light transmitting property. The interlayer 522 is provided to planarize the surface of the liquid crystal layer 540 side on which the common electrode 523 is formed, by reducing unevenness caused by the light shielding layer 521 or the like. As a method of forming the interlayer 522, for example, a film forming method using a plasma chemical vapor deposition (CVD) method or the like can be used.

The common electrode 523 is made of, for example, a conductive film having a light transmitting property, such as Indium Tin Oxide (ITO) or Indium Zinc Oxide (IZO). The common electrode 523 covers the interlayer 522, and is electrically connected to the wiring on element substrate 510 side by the upper and lower conduction portions 556 provided at the four corners of the counter substrate 520, as illustrated in FIG. 13.

The alignment film 518 and the alignment film 524 are selected based on the optical design of the liquid crystal device 501. As the alignment film 518 and the alignment film 524, for example, an alignment film that is formed using an organic material such as polyimide and subjected to a substantially horizontal alignment treatment to the liquid crystal molecules by rubbing the surface of the film, or an alignment film that is formed using an inorganic material such as $SiO_x$ (silicon oxide) by a vapor phase growth method and subjected to a substantially vertical alignment treatment to the liquid crystal molecules, can be used.

The liquid crystal included in the liquid crystal layer 540 modulates light to allow a gradation display by the change in the alignment or the order of molecular aggregates according to the applied voltage level. For example, in a case of a normally white mode, the transmittance of incident light decreases according to the voltage applied to each pixel P. In a case of a normally black mode, the transmittance of incident light increases according to the voltage applied to each pixel P. Thus, light having contrast according to the image signal is emitted from the liquid crystal device 501 as a whole.

As illustrated in FIG. 15, in the display region E, gate wirings (scanning lines) 503a and data lines 506a are formed so as to be insulated and intersected with each other. The direction to which the gate wirings 503a are extended is the X-direction, and the direction to which the data lines 506a are extended is the Y-direction. The pixels P are provided to correspond to the intersections of the gate wirings 503a and the data lines 506a. In each pixel P, a pixel electrode 515, and a thin film transistor (TFT) 530 as a switching element are provided.

The source electrode 531 (refer to FIG. 16) of the TFT 530 is electrically connected to the data line 506a. The data line 506a is connected to the data line driving circuit 551 (refer to FIG. 13), and supplies the image signal (data signal) S1, S2, . . . , Sn supplied from the data line driving circuit 551 to the pixel P. The image signal S1, S2, . . . , Sn supplied from the data line driving circuit 551 to the data line 506a may be line-sequentially supplied in this order, or may be supplied for each group with a plurality of data lines 506a adjacent to each other.

The gate electrode 530g (refer to FIG. 16) of the TFT 530 is electrically connected to the gate wiring (scanning line) 503a. In this embodiment, the gate electrode 530g is a part of the gate wiring (scanning line) 503a. The gate wiring (scanning line) 503a is connected to the scanning line driving circuit 552 (refer to FIG. 13), and supplies the scanning signals G1, G2, . . . , Gm supplied from the scanning line driving circuit 552 to each pixel P. The scanning line driving circuit 552 line-sequentially supplies the scanning signals G1, G2, . . . , Gm to the gate wiring (scanning line) 503a using a pulse at a predetermined timing. The drain electrode 532 (refer to FIG. 16) of the TFT 530 is electrically connected to the pixel electrode 515.

The TFT 530 is in a turned-on state only for a certain period, and thus the image signals S1, S2, . . . , Sn are written to the pixel electrode 515 via the data line 506a at a predetermined timing. The image signals with a predetermined level that are written to the liquid crystal layer 540 via the pixel electrode 515 are held for a certain period in the liquid crystal capacitor formed between the pixel electrode 515 and the common electrode 523 (refer to FIG. 14) provided on the counter substrate 520.

In order to prevent the image signals S1, S2, . . . , Sn that are held from leaking, a storage capacitor 516 is formed between a capacitor line 516a and the pixel electrode 515 that are formed so as to parallel to the data line 506a along the data line 506a, and disposed parallel to the liquid crystal capacitor. As described above, when a voltage signal is applied to the liquid crystal of each pixel P, the alignment state of the liquid crystal is changed according to the applied voltage level. Accordingly, light incident to the liquid crystal layer 540 (refer to FIG. 14) is modulated, and thus gradation display can be realized.

The data line 506a is connected to the inspection circuit 553 illustrated in FIG. 13. The inspection circuit 553 is configured to check the operation defect or the like of the liquid crystal device 501, by detecting the image signals in the process of manufacturing the liquid crystal device 501. Here, the inspection circuit 553 is not illustrated in the equivalent circuit diagram of FIG. 15. The inspection circuit 553 may include a sampling circuit for sampling the image signal and supplying the image signal subjected to the sampling to the data line 506a, and a precharge circuit for supplying a precharge signal with a predetermined voltage level to the data line 506a prior to the image signal.

Element Substrate

Figure 16:
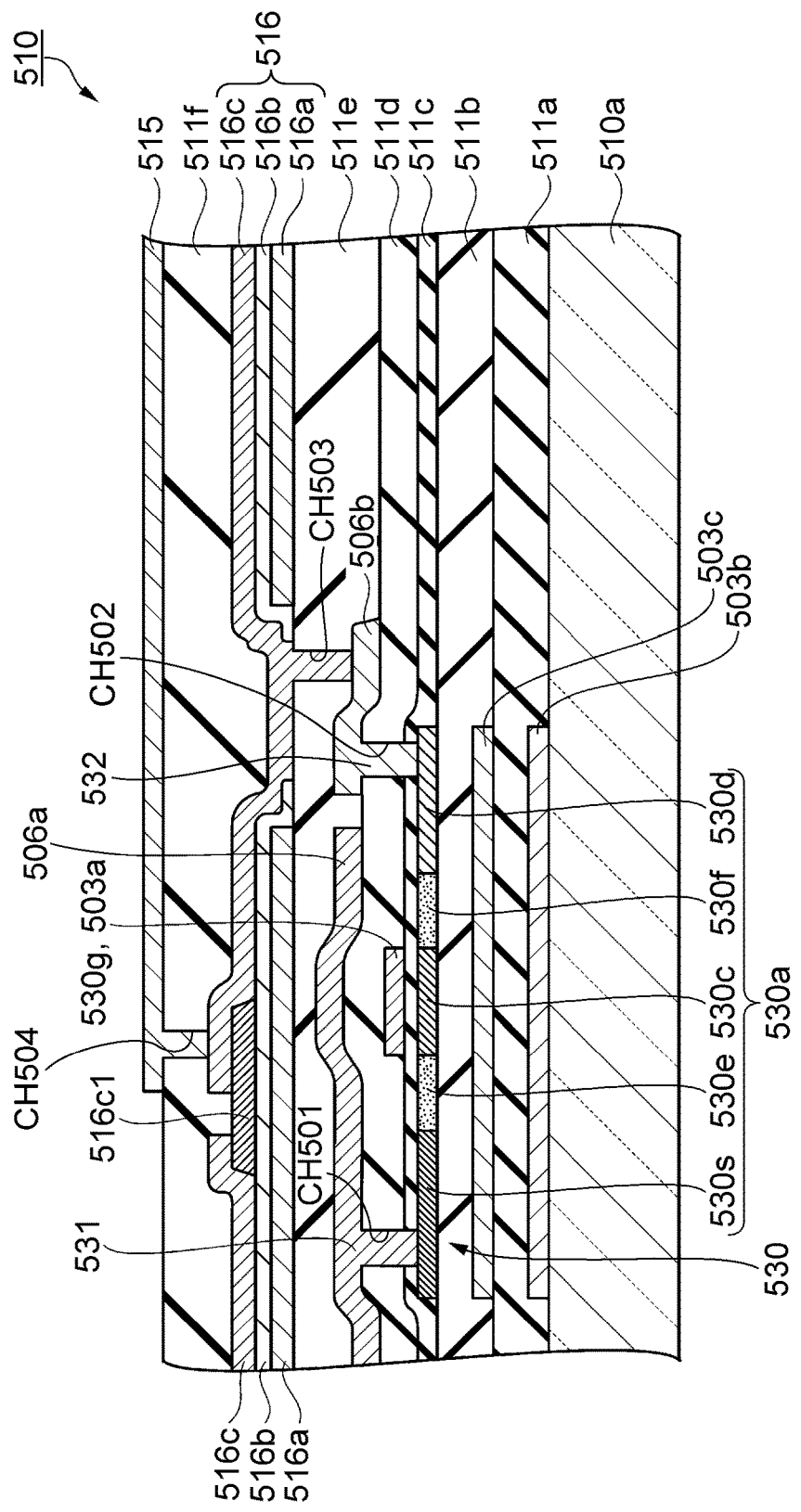
FIG. 16 is a schematic sectional view illustrating the configuration of an element substrate of the liquid crystal device according to the fourth embodiment.

FIG. 16 is a schematic sectional view illustrating the configuration of an element substrate of the liquid crystal device according to the fourth embodiment. As illustrated in FIG. 16, the element substrate 510 includes a substrate 510a as a first substrate, a lower light shielding layer 503b as a first light shielding layer, an interlayer insulating layer 511a as a first insulating layer, an upper light shielding layer 503c as a second light shielding layer, an interlayer insulating layer 511b as a second insulating layer, a TFT 530, a data line 506a, a storage capacitor 516, and a pixel electrode 515.

The lower light shielding layer 503b is formed on the substrate 510a. The lower light shielding layer 503b is made of, for example, a single metal, an alloy, a metal silicide, a polysilicide, a nitride, or a material obtained by stacking the above-mentioned material that includes at least one of metals such as aluminum (Al), titanium (Ti), chromium (Cr), tungsten (W), tantalum (Ta), or molybdenum (Mo). The lower light shielding layer 503b has a conductivity and a light shielding property. The thickness of the lower light shielding layer 503b is, for example, approximately 200 nm.

The interlayer insulating layer 511a is formed so as to cover the substrate 510a and the lower light shielding layer 503b. The interlayer insulating layer 511a is made of, for example, a silicon oxide film or the like. The thickness of the interlayer insulating layer 511a is, for example, approximately 400 nm to 5300 nm.

The upper light shielding layer 503c is formed on the interlayer insulating layer 511a. The upper light shielding layer 503c is made of, for example, a single metal, an alloy, a metal silicide, a polysilicide, a nitride, or a material obtained by stacking the above-mentioned material that includes at least one of the same metals as the lower light shielding layer 503b. The upper light shielding layer 503c has a conductivity and a light shielding property. The thickness of the upper light shielding layer 503c is, for example, approximately 100 nm. The lower light shielding layer 503b and the upper light shielding layer 503c shield light incident from the substrate 510a side, and function as a scanning line.

The interlayer insulating layer 511b is formed so as to cover the interlayer insulating layer 511a and the upper light shielding layer 503c. The interlayer insulating layer 511b is made of, for example, a silicon oxide film or the like. The thickness of the interlayer insulating layer 511b is, for example, approximately 5300 nm to 400 nm.

The TFT 530 is provided on the interlayer insulating layer 511b. The TFT 530 includes the semiconductor layer 530a, a gate insulating layer 511c, the gate electrode 530g, the source electrode 531, and the drain electrode 532. The semiconductor layer 530a is formed in an island shape on the interlayer insulating layer 511b. The semiconductor layer 530a is made of, for example, a polycrystalline silicon film, and N-type impurity ions such as phosphorus (P) ions are implanted to the semiconductor layer 530a.

The semiconductor layer 530a has a lightly doped drain (LDD) structure that includes a data line side source-drain region 530s (hereinafter, referred to as a source region), a pixel electrode side source-drain region 530d (hereinafter, referred to as a drain region), a channel region 530c, a data line side LDD region 530e provided between the source region 530s and the channel region 530c, and a pixel electrode side LDD region 530f provided between the channel region 530c and the drain region 530d. The thickness of the semiconductor layer 530a is, for example, approximately 50 nm.

P-type impurity ions such as boron (B) ions are doped in the channel region 530c. N-type impurity ions such as phosphorus (P) ions are doped in the source region 530s, the drain region 530d, the data line side LDD region 530e, and the pixel electrode side LDD region 530f. According to the configuration, the TFT 530 is formed as an N-type TFT.

The gate insulating layer 511c is formed so as to cover the interlayer insulating layer 511b and the semiconductor layer 530a. The gate insulating layer 511c is made of, for example, a silicon oxide film or the like. The gate electrode 530g is formed on the gate insulating layer 511c so as to be opposed to the channel region 530c with the gate insulating layer 511c interposed therebetween. The gate electrode 530g (gate wiring 503a) is made of, for example, a polycrystalline silicon film.

The interlayer insulating layer 511d is formed so as to cover the gate insulating layer 511c and the gate electrode 530g. The interlayer insulating layer 511d is made of, for example, a silicon oxide film or the like. A contact hole CH501 penetrating the interlayer insulating layer 511d and the gate insulating layer 511c is formed at the position overlapped with the end portion of the source region 530s side of the semiconductor layer 530a. A contact hole CH502 penetrating the interlayer insulating layer 511d and the gate insulating layer 511c is formed at the position overlapped with the end portion of the drain region 530d side.

The data line 506a and a relay electrode 506b are formed on the interlayer insulating layer 511d. The data line 506a and the relay electrode 506b are made of, for example, a single metal, an alloy, a metal silicide, a polysilicide, a nitride, or a material obtained by stacking the above-mentioned material that includes at least one of metals such as Al, Ti, Cr, W, Ta, or Mo. The data line 506a and the relay electrode 506b have conductivity and a light shielding property.

The data line 506a and the relay electrode 506b is obtained, for example, by forming a conductive film using the same material and patterning the conductive film. The source electrode 531 is formed by filling the contact hole CH501 with the material forming the data line 506a and the relay electrode 506b, and the drain electrode 532 is formed by filling the contact hole CH502.

An interlayer insulating layer 511e is formed so as to cover the data line 506a, the relay electrode 506b, and the interlayer insulating layer 511d. The interlayer insulating layer 511e is made of, for example, a silicon oxide or a silicon nitride. The interlayer insulating layer 511e is subjected to a planarization process for planarizing the unevenness of the surface that is caused by covering the region in which the TFT 530 is provided. As a method for the planarization process, for example, a chemical mechanical polishing (CMP) process, a spin coating process, or the like may be used.

In the interlayer insulating layer 511e, a contact hole CH503 penetrating the interlayer insulating layer 511e is formed at the position overlapped with the relay electrode 506b. The capacitor line 516a constituting a part of the storage capacitor 516 (COM potential) is formed on the interlayer insulating layer 511e. The capacitor line 516a has a multilayer structure in which, for example, an aluminum (Al) film is disposed in the lower layer and a titanium nitride (TiN) film is disposed in the upper layer.

A capacitor insulating film 516b that is made of an alumina film, silicon nitride film, or the like is formed so as to cover the capacitor line 516a. A stopper film 516c1 that is made of a silicon oxide film or the like is formed on the capacitor insulating film 516b in the vicinity of the region overlapped with the region of a contact hole CH504 in a plan view. The stopper film 516c1 may be formed, before forming the capacitor insulating film 516b, that is, between the capacitor line 516a and the capacitor insulating film 516b.

A capacitor electrode 516c constituting a part of the storage capacitor 516 is formed on the stopper film 516c1, the capacitor insulating film 516b, and the interlayer insulating layer 511e so as to overlap the relay electrode 506b in a plan view. The capacitor electrode 516c is formed by forming a conductive film using a conduction portion material having light shielding properties such as aluminum (Al) and patterning the conductive film. The capacitor electrode 516c is patterned on the stopper film 516c1 so as to be separated from the adjacent capacitor electrode 516c.

The capacitor electrode 516c is also formed in the contact hole CH503. Thus, the capacitor electrode 516c is electrically connected to the relay electrode 506b via the contact hole CH503, and electrically connected to the drain electrode 532. The capacitor electrode 516c also functions as a relay electrode that electrically connects the relay electrode 506b to the pixel electrode 515 via the contact hole CH503.

An interlayer insulating layer 511f is formed on the capacitor electrode 516c. The interlayer insulating layer 511f is made of, for example, silicon oxide or silicon nitride. The interlayer insulating layer 511f also may be subjected to a planarization process as in the interlayer insulating layer 511e. The contact hole CH504 penetrating the interlayer insulating layer 511f is formed at the position overlapped with the capacitor electrode 516c. The contact hole CH504 is formed, for example, on the capacitor electrode 516c at the position overlapped with the stopper film 516c1 in a plan view.

The pixel electrode 515 is formed on the interlayer insulating layer 511f so as to overlap with the capacitor electrode 516c and the contact hole CH504 in a plan view. The pixel electrode 515 is formed with a transparent conductive film such as ITO, and also formed in the contact hole CH504. Thus, the pixel electrode 515 is electrically connected to the capacitor electrode 516c via the contact hole CH504, and electrically connected to the drain electrode 532 via the contact hole CH503 and the relay electrode 506b.

Light Shielding Configuration of Element Substrate

In a case where the liquid crystal device 501 illustrated in FIG. 14 is used as the liquid crystal light bulb of the projector, light that is emitted from the light source is incident from the counter substrate 520 side, transmitted through the liquid crystal layer 540, and emitted to the element substrate 510 side. In the element substrate 510 illustrated in FIG. 16, the capacitor electrode 516c, the data line 506a, and the relay electrode 506b shield light that is incident to the semiconductor layer 530a from the counter substrate 520 side (upper side in FIG. 16), thereby preventing the malfunction of the TFT 530 due to light.

In recent years, there is a case where the amount of light from the light source increases and an inorganic polarizing plate having high light reflectivity compared to the related art is used in sometimes. For this reason, it is required to improve the light shielding properties of the reflected light or the like that is incident from the element substrate 510 side (back surface) from which light of the light liquid crystal device 501 is emitted, compared to the related art. Further, in a large liquid crystal device having a diagonal size of approximately one inch, it is highly necessary to drive using a high frequency driving signal, and thus it is also required to decrease the wiring resistance of the gate wiring 503a.

Therefore, the liquid crystal device 501 according to this embodiment has a light shielding configuration for shielding light incident from the element substrate 510 side (back side), and thus the wiring resistance of the scanning line decreases by the light shielding configuration. Hereinafter, the light shielding configuration of the liquid crystal device 501 will be described with reference to FIGS. 17 and 18.

Figure 17:
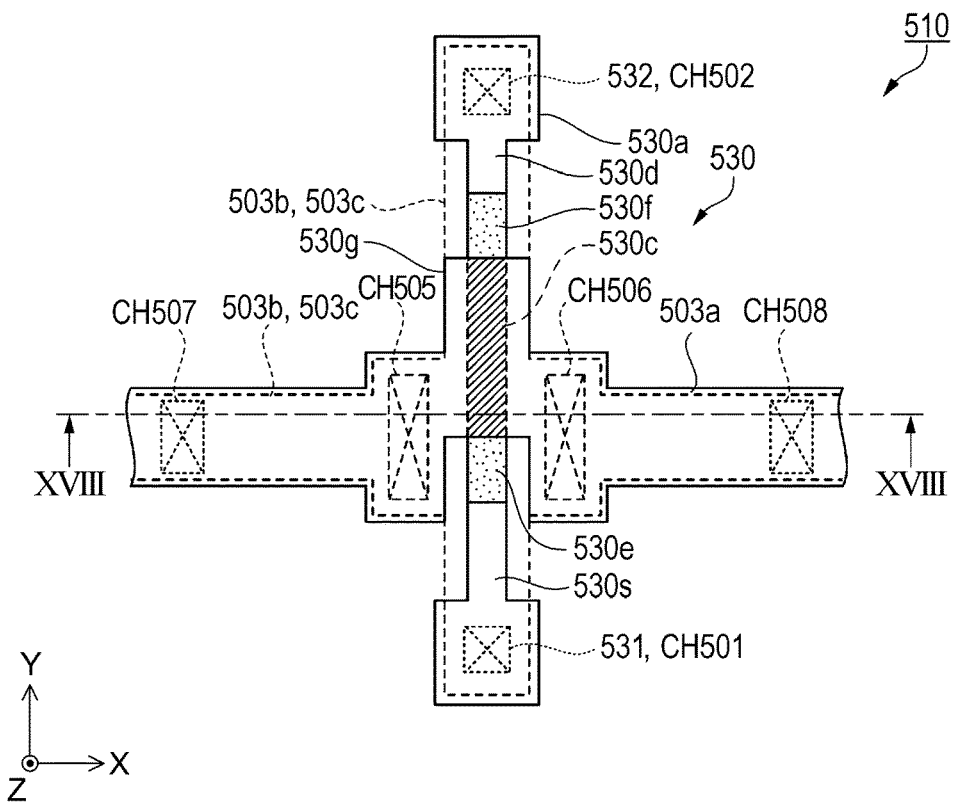
FIG. 17 is a schematic plan view illustrating the configuration of the TFT portion of the element substrate according to the fourth embodiment.
Figure 18:
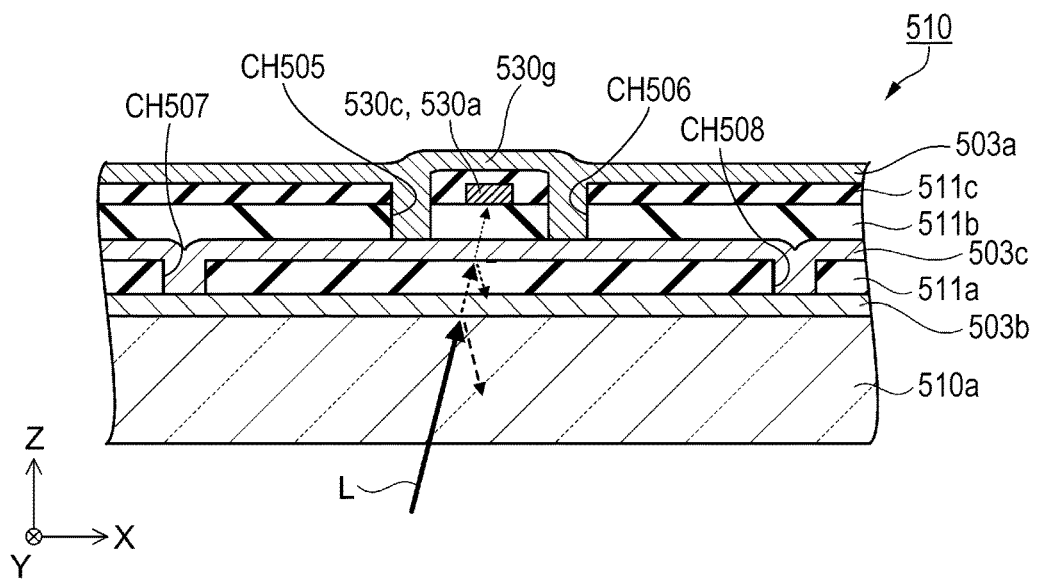
FIG. 18 is a schematic sectional view taken along line XVIII-XVIII in FIG. 17.

FIG. 17 is a schematic plan view illustrating the configuration of the TFT portion of the element substrate according to the fourth embodiment. FIG. 18 is a schematic sectional view taken along line XVIII-XVIII in FIG. 17. The line XVIII-XVIII in FIG. 17 is a line along the X-direction intersecting the direction to which the semiconductor layer 530a extends. In FIGS. 17 and 18, the components in the higher layers than the gate electrode 530g (gate wiring 503a) are not illustrated.

In the element substrate 510 according to the fourth embodiment, the intersection portion of the gate wiring 503a extending along the X-direction and the data line 506a (refer to FIG. 15) extending along the Y-direction is illustrated in FIG. 17. The semiconductor layer 530a of the TFT 530 extends to the both sides of the intersection portion of the gate wiring 503a and the data line 506a along the Y-direction. The semiconductor layer 530a is disposed so as to overlap with the data line 506a in a plan view. The portion of the gate wiring 503a that is overlapped with the channel region 530c of the semiconductor layer 530a in a plan view becomes the gate electrode 530g. In other words, the gate electrode 530g overlaps with the channel region 530c of the semiconductor layer 530a in a plan view.

The lower light shielding layer 503b and the upper light shielding layer 503c are disposed so as to overlap with the gate wiring 503a in a plan view, and provided between the pixels P (refer to FIG. 13) in the X-direction. The lower light shielding layer 503b and the upper light shielding layer 503c are disposed at the intersection portion of the gate wiring 503a and the data lines 506a so as to overlap with at least the channel region 530c of the semiconductor layer 530a in a plan view.

As described above, the TFT 530 is provided in the vicinity of the intersection portion of the non-opening region between the pixels P that has a light shielding property, and thus it is possible to prevent the malfunction of the TFT 530 due to light, and ensure the aperture ratio of the opening region of the pixel P.

As illustrated in FIGS. 17 and 18, a contact hole CH505 as a third contact hole penetrating the gate insulating layer 511c and the interlayer insulating layer 511b, and a contact hole CH506 as a fourth contact hole are formed at both outsides of the semiconductor layer 530a (channel region 530c) in the X-direction. The contact holes CH505 and CH506 are filled with the material forming the gate electrode 530g (gate wiring 503a), and thus the gate electrode 530g (gate wiring 503a) is electrically connected to the upper light shielding layer 503c.

A contact hole CH507 as a first contact hole penetrating the interlayer insulating layer 511a, and a contact hole CH508 as a second contact hole are formed at both outsides of the semiconductor layer 530a (channel region 530c) in the X-direction. The contact hole CH507 is disposed at a further outside of the semiconductor layer 530a than the contact hole CH505, and the contact hole CH508 is disposed at a further outside of the semiconductor layer 530a than the contact hole CH506.

The contact holes CH507 and CH508 are filled with the material forming the upper light shielding layer 503c, and thus the upper light shielding layer 503c that is electrically connected to the gate electrode 530g (gate wiring 503a) is electrically connected to the lower light shielding layer 503b. In other words, both of the upper light shielding layer 503c and the lower light shielding layer 503b are set to the same potential as that of the gate electrode 530g. Therefore, the scanning line is configured with the three layers of the gate wiring 503a, the upper light shielding layer 503c, and the lower light shielding layer 503b.

The positions of the contact holes CH507 and CH508 are not particularly limited. However, there is a case where a recess occurs at the positions of the contact holes CH507 and CH508 on the surface of the upper light shielding layer 503c. Therefore, it is preferably that the contact holes CH507 and CH508 are disposed so as not to overlap with the upper contact holes CH505 and CH506 in a plan view.

In the element substrate 510 according to the fourth embodiment, the upper light shielding layer 503c and the lower light shielding layer 503b are disposed between the semiconductor layer 530a and the substrate 510a so as to overlap with the semiconductor layer 530a in a plan view. Therefore, it is possible to shield light incident to the semiconductor layer 530a from the substrate 510a side.

A pair of light shielding portions along the Z-direction that are formed by the contact holes CH505 and CH506 penetrating the interlayer insulating layer 511b beneath the semiconductor layer 530a, and a pair of light shielding portions along the Z-direction that are formed by the contact holes CH507 and CH508 penetrating the interlayer insulating layer 511a beneath the upper light shielding layer 503c, are disposed at both outsides of the semiconductor layer 530a. Therefore, it is possible to shield light that is incident at an angle with respect to the Z-direction from the substrate 510a side, and light reflected and propagated between the gate wiring 503a and the upper light shielding layer 503c or between the upper light shielding layer 503c and the lower light shielding layer 503b, from both outsides of the semiconductor layer 530a.

Figure 19:
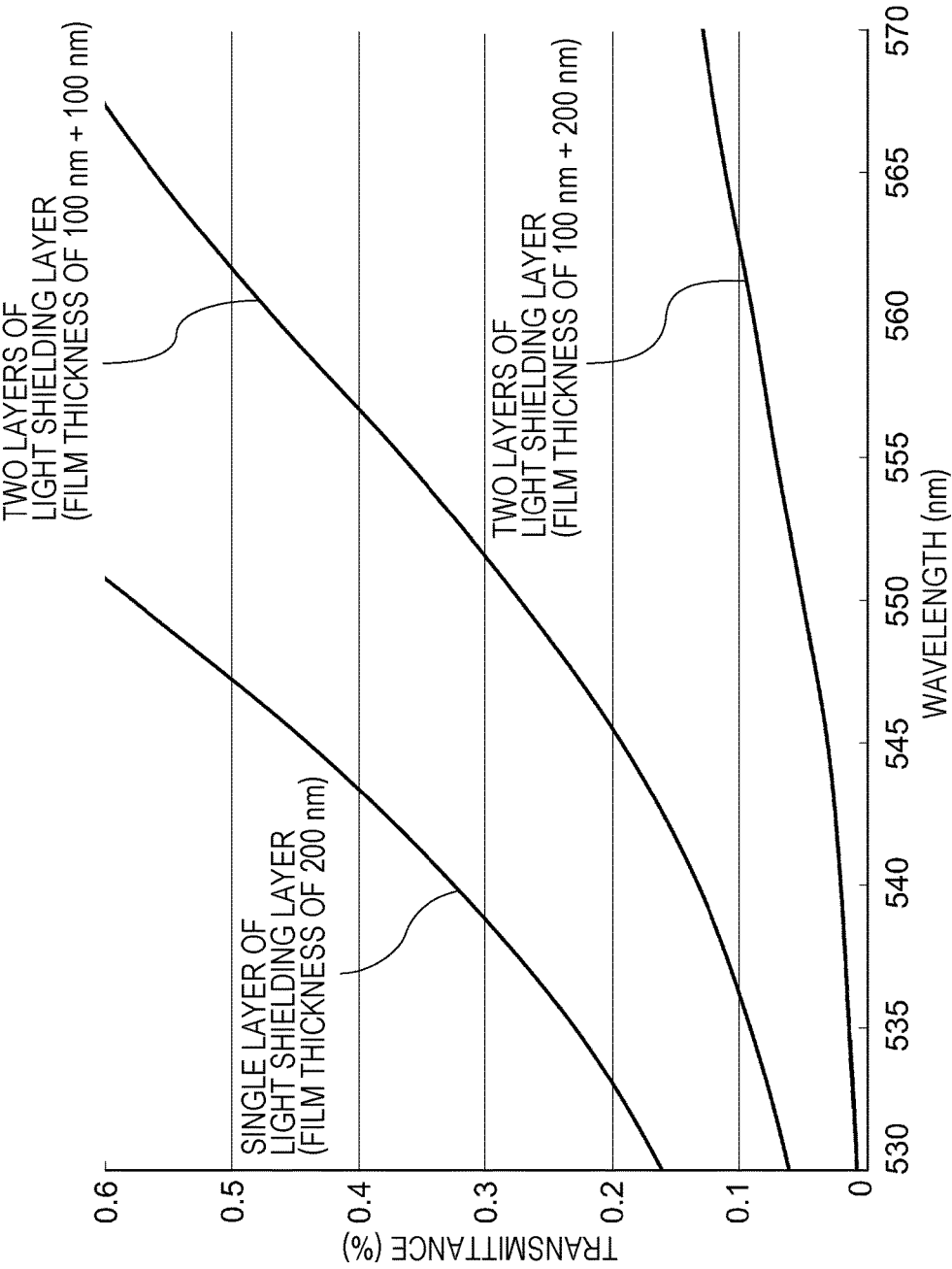
FIG. 19 is a graph illustrating the light shielding effect of the element substrate according to the fourth embodiment.
Figure 27:
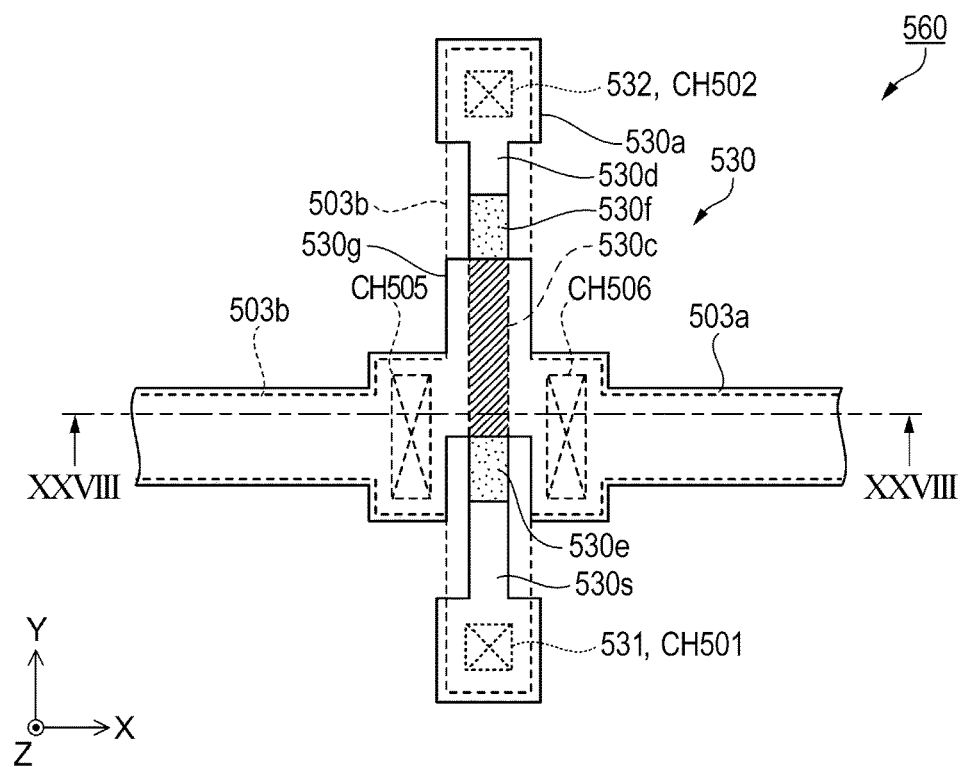
FIG. 27 is a schematic plan view illustrating a configuration example of a TFT portion of an element substrate of the related art.
Figure 28:
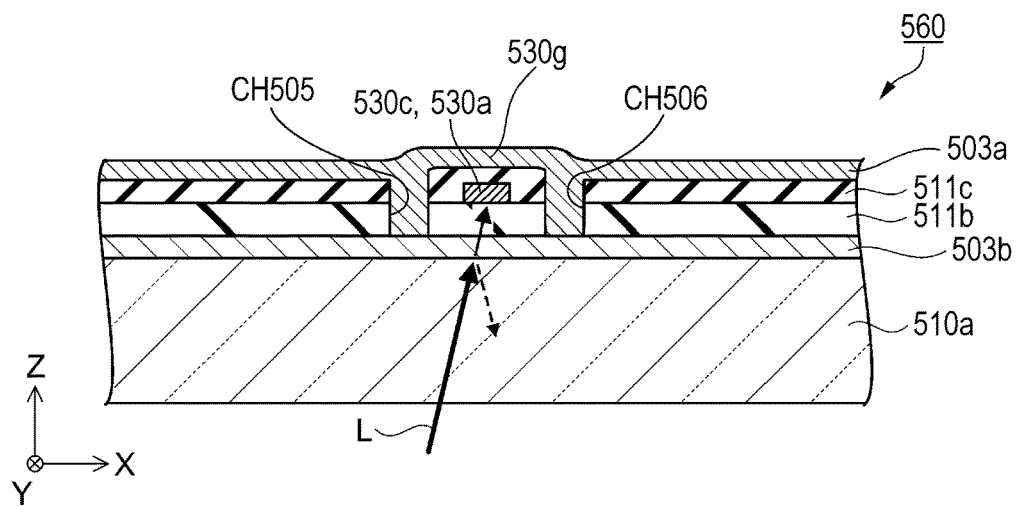
FIG. 28 is a schematic sectional view taken along line XXVIII-XXVIII in FIG. 27.

Hereinafter, the light shielding effect of the element substrate 510 according to the fourth embodiment will be described in comparison with the element substrate having the configuration of the related art. FIG. 19 is a graph illustrating the light shielding effect of the element substrate according to the fourth embodiment. FIG. 27 is a schematic plan view illustrating a configuration example of the TFT portion of the element substrate of the related art. FIG. 28 is a schematic sectional view taken along line XXVIII-XXVIII in FIG. 27. In FIGS. 27 and 28, the components in the higher layers than the gate electrode 530g (gate wiring 503a) are not illustrated.

It is assumed that the element substrate 560 of the related art illustrated in FIGS. 27 and 28 is different from the element substrate 510 according to the fourth embodiment in that the light shielding layer disposed between the semiconductor layer 530a and the substrate 510a has a single layer (only the lower light shielding layer 503b). The thickness of the lower light shielding layer 503b is approximately 200 nm, similarly to the element substrate 510. The lower light shielding layer 503b is electrically connected to the gate electrode 530g (gate wiring 503a) via the contact holes CH505 and CH506. In other words, in the element substrate 560 of the related art, the scanning line is configured with the two layers of the gate wiring 503a and the lower light shielding layer 503b.

As illustrated in FIG. 28, in the element substrate 560 of the related art, a part of incident light L that is incident at an angle with respect to the normal direction of the substrate 510a (Z-direction) from the substrate 510a side is reflected at the interface between the substrate 510a and the lower light shielding layer 503b. Another part of incident light L is absorbed into the lower light shielding layer 503b and transmitted through the lower light shielding layer 503b. A part of the transmitted light is incident to the channel region 530c of the semiconductor layer 530a. In contrast, as illustrated in FIG. 18, in the element substrate 510 according to the fourth embodiment, incident light L incident from the substrate 510a side is reflected at the interface between the substrate 510a and the lower light shielding layer 503b. Further, a part of light that is transmitted through the lower light shielding layer 503b is reflected at the interface between the interlayer insulating layer 511a and the upper light shielding layer 503c. Therefore, it is possible to more effectively shield light incident to the channel region 530c of the semiconductor layer 530a.

In FIG. 19, the horizontal axis represents the wavelength (nm) of incident light L, and the vertical axis represents the transmittance (%) of incident light L transmitted through the light shielding layer. The light shielding layer with a single layer (film thickness of 200 nm) illustrated in FIG. 19 represents the transmittance according to the configuration of the element substrate 560, and the two layers of the light shielding layer (film thickness of 100 nm+200 nm) represents the transmittance according to the configuration of the element substrate 510 of the fourth embodiment. The two layers of the light shielding layer (film thickness of 100 nm+100 nm) represents the transmittance according to a comparative example in which the thickness of the lower light shielding layer 503b in the element substrate 510 is set to 100 nm.

As illustrated in FIG. 19, the transmittance according the configuration of the element substrate 510 of the fourth embodiment remarkably decreases, compared to the transmittance according to the configuration of the element substrate 560 in the related art. This shows that the light shielding properties are improved than the related art by further providing the upper light shielding layer 503c between the semiconductor layer 530a and the lower light shielding layer 503b.

In the comparative example in which the thickness of the lower light shielding layer 503b in the element substrate 510 is set to 100 nm, although the total thickness of the two layers of the light shielding layer is 200 nm and the same as that of the element substrate 560 in the related art, the transmittance according to the comparative example decreases, compared to the transmittance according to the configuration of the element substrate 560 in the related art. This shows that even though the (total) thickness of the light shielding layer is the same, the two layers of the light shielding layer that have the interlayer insulating layer (interlayer insulating layer 511a) interposed therebetween is provided, and thus the reflection at the interface increases, thereby improving the light shielding properties compared to the related art. In FIG. 19, although the range of the horizontal axis is set to substantially the center of a visible light wavelength region, the magnitude relationship in the transmittance is substantially the same in the entire visible light wavelength region.

In the configuration of the element substrate 510 according to the fourth embodiment, when the thickness of the lower light shielding layer 503b and the thickness of the upper light shielding layer 503c are set to 200 nm (two layers of 200 nm+200 nm), the light shielding properties are expected to be further improved. However, the step that occurs in the upper layer due to the two layers of the light shielding layer becomes larger, and thus it is preferably that the thickness of the upper light shielding layer 503c is set to 100 nm.

In the element substrate 560 in the related art, the scanning line is configured with the two layers of the gate wiring 503a and the lower light shielding layer 503b. In contrast, in the element substrate 510 according to the fourth embodiment, the scanning line is configured with the three layers of the gate wiring 503a, the lower light shielding layer 503b, and the upper light shielding layer 503c, and thus it is possible to decrease the wiring resistance of the scanning line, compared to the related art. Therefore, even when the liquid crystal device 501 is a large liquid crystal device that is driven by a high frequency driving signal, it is possible to decrease the wiring resistance of the scanning line, while improving the light shielding properties of incident light L incident from the substrate 510a side, compared to the related art.

The lower light shielding layer 503b and the upper light shielding layer 503c are provided straddling the boundary between the pixels P, and thus the contact holes CH507 and CH508 for electrically connecting the lower light shielding layer 503b and the upper light shielding layer 503c may not be provided for each pixel P. In other words, in a case where the lower light shielding layer 503b and the upper light shielding layer 503c are formed straddling the boundary between the pixels P, the number of the contact holes CH507 and CH508 may be less than the number of the pixels P.

As described above, according to the configuration of the element substrate 510 of the fourth embodiment, the following effects can be obtained.

(6) The lower light shielding layer 503b, the interlayer insulating layer 511a, and the upper light shielding layer 503c are disposed between the substrate 510a and the semiconductor layer 530a. Thus, incident light L incident from the substrate 510a side toward the semiconductor layer 530a side is reflected at the interface between the substrate 510a and the lower light shielding layer 503b, and further reflected at the interface between the interlayer insulating layer 511a and the upper light shielding layer 503c. Therefore, it is possible to effectively shield incident light L incident from the substrate 510a side to the semiconductor layer 530a. Further, the lower light shielding layer 503b and the upper light shielding layer 503c are set to have the same potential as that of the gate electrode 530g, and thus it is possible to configure the scanning line using the three layers that includes the two layers of the gate wiring 503a and the light shielding layer, thereby decreasing the wiring resistance of the scanning line. As a result, it is possible to decrease the wiring resistance of the scanning line while improving the light shielding properties compared to the related art, thereby providing the liquid crystal device 501 having a high display quality.

(7) The lower light shielding layer 503b and the upper light shielding layer 503c that constitute the scanning line are formed straddling the boundary between the pixels P, and thus, even in a case where the liquid crystal device 501 is a large liquid crystal device including the scanning line with a long length, it is possible to decrease the wiring resistance of the scanning line while improving the light shielding property.

(8) The pair of the light shielding portions along the Z-direction are formed between the lower light shielding layer 503b and the upper light shielding layer 503c by the contact holes CH507 and CH508 penetrating the interlayer insulating layer 511a. The pair of the light shielding portions are disposed at both sides of the semiconductor layer 530a in a plan view. Therefore, it is possible to shield incident light L that is incident at an angle with respect to the Z-direction from the substrate 510a side, and light reflected and propagated between the upper light shielding layer 503c and the lower light shielding layer 503b, from both sides of the semiconductor layer 530a, by the light shielding portions formed by the contact holes CH507 and CH508, thereby further improving the light shielding property.

(9) The pair of light shielding portions along the Z-direction are formed by the contact holes CH505 and CH506 penetrating the gate insulating layer 511c and the interlayer insulating layer 511b. The pair of light shielding portions are disposed at both outsides of the semiconductor layer 530a in a plan view. Therefore, it is possible to shield incident light L that is incident at an angle with respect to the Z-direction from the substrate 510a side, and light reflected and propagated between the gate wiring 503a and the upper light shielding layer 503c, from both outsides of the semiconductor layer 530a, by the light shielding portions formed by the contact holes CH505 and CH506, thereby further improving the light shielding property.

Fifth Embodiment

Light Shielding Configuration of Element Substrate

Figure 20:
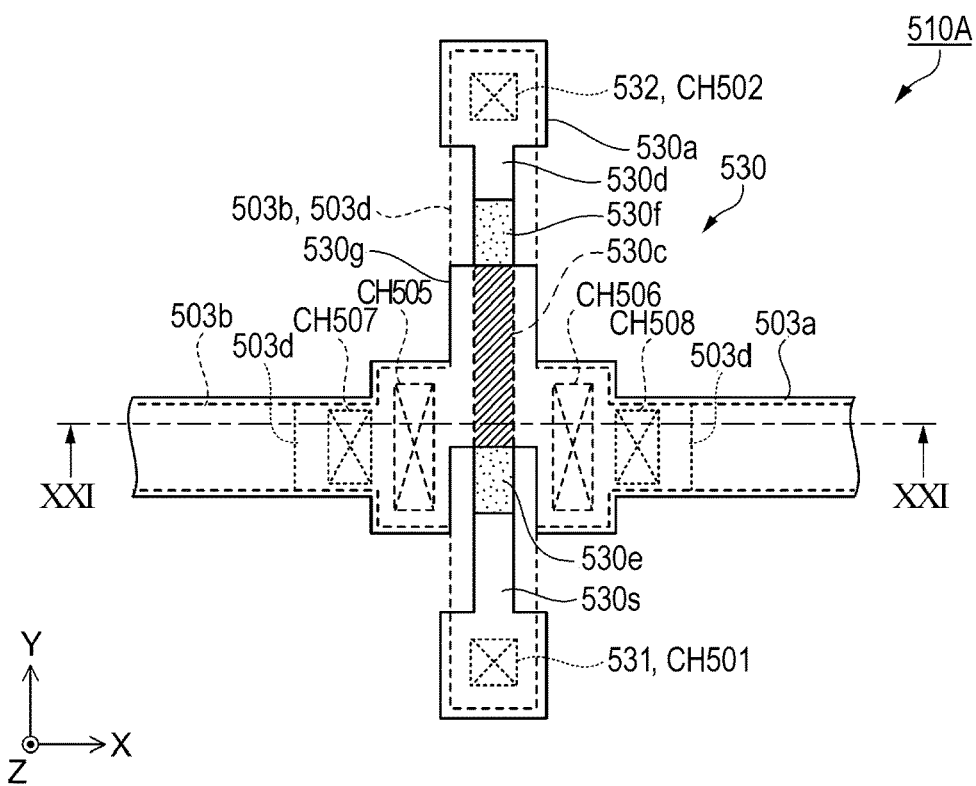
FIG. 20 is a schematic plan view illustrating the configuration of a TFT portion of an element substrate according to a fifth embodiment.
Figure 21:
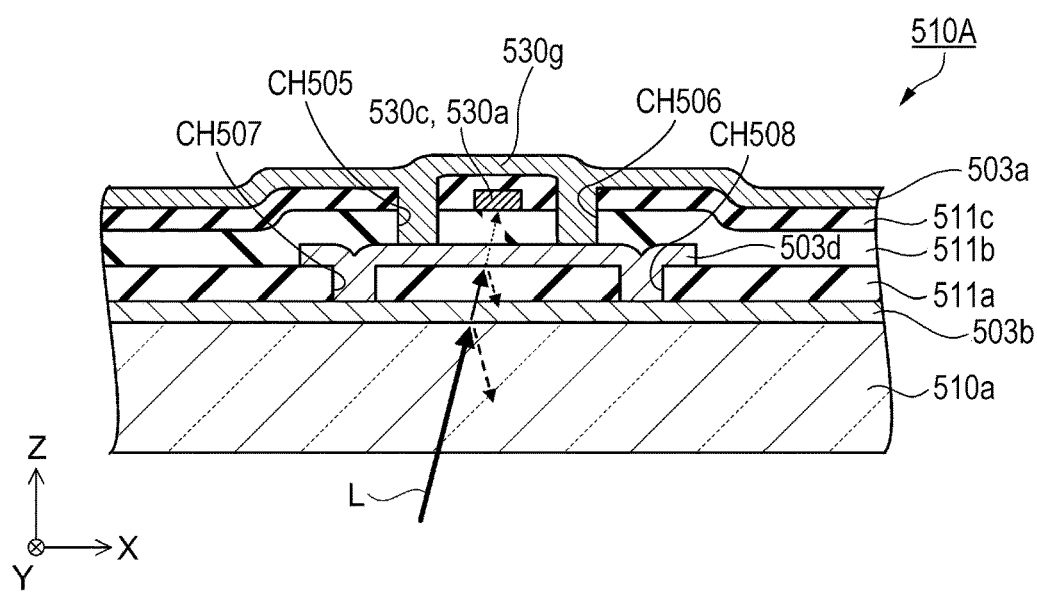
FIG. 21 is a schematic sectional view taken along line XXI-XXI in FIG. 20.

Next, the light shielding configuration of the element substrate according to a fifth embodiment will be described with reference to FIGS. 20 and 21. FIG. 20 is a schematic plan view illustrating the configuration of the TFT portion of the element substrate according to the fifth embodiment. FIG. 21 is a schematic sectional view taken along line XXI-XXI in FIG. 20.

The element substrate 510A according to the fifth embodiment has the same configuration as that of the element substrate 510 according to the fourth embodiment, except that the upper light shielding layer 503d as a second light shielding layer is formed to be separated for each pixel P. Hereinafter, the differences from the fourth embodiment will be described. The same reference numerals are given to the same components as those of the fourth embodiment, and detailed description thereof will be omitted.

As illustrated in FIGS. 20 and 21, the element substrate 510A according to the fifth embodiment is provided with the lower light shielding layer 503b, the interlayer insulating layer 511a, and the upper light shielding layer 503d, between the substrate 510a and the semiconductor layer 530a. In the fourth embodiment, the upper light shielding layer 503c is provided straddling the boundary between the pixels P in the X-direction. In contrast, in the fifth embodiment, the upper light shielding layer 503d is provided to be separated for each pixel P, and the lower light shielding layer 503b is formed straddling the boundary between the pixels P.

The upper light shielding layer 503d according to the fifth embodiment is formed of the same material as that of the upper light shielding layer 503c according to the fourth embodiment, and formed to have the same thickness as that of the upper light shielding layer 503c according to the fourth embodiment. The upper light shielding layer 503d is electrically connected to the lower light shielding layer 503b via the contact holes CH507 and CH508 penetrating the interlayer insulating layer 511a. The contact hole CH507 is disposed at a further outside of the semiconductor layer 530a than the contact hole CH505, and the contact hole CH508 is disposed at a further outside of the semiconductor layer 530a than the contact hole CH506.

According to the configuration of the element substrate 510A of the fifth embodiment, even though the upper light shielding layer 503d is separated for each pixel P, the lower light shielding layer 503b, the interlayer insulating layer 511a, and the upper light shielding layer 503d are disposed between the substrate 510a and the semiconductor layer 530a, and thus it is possible to improve the light shielding properties compared to the related art, similarly to the fourth embodiment. Even in a case where, as in the element substrate 560 in the related art that is illustrated in FIGS. 27 and 28, only the lower light shielding layer 503b is disposed between the substrate 510a and the semiconductor layer 530a, it is possible to decrease the wiring resistance of the scanning line. The configuration according to the fifth embodiment can be applied to a case where the size of the liquid crystal device 501 is small and decreasing the wiring resistance of the scanning line is not important.

According to the configuration of the element substrate 510A of the fifth embodiment, the following effects can be obtained.

(10) Even though the upper light shielding layer 503d is separated for each pixel P, the lower light shielding layer 503b, the interlayer insulating layer 511a, and the upper light shielding layer 503d are disposed between the substrate 510a and the semiconductor layer 530a, and thus it is possible to improve the light shielding properties compared to the related art, similarly to the fourth embodiment. Further, it is possible to decrease the wiring resistance of the scanning line.

Sixth Embodiment

Light Shielding Configuration of Element Substrate

Figure 22:
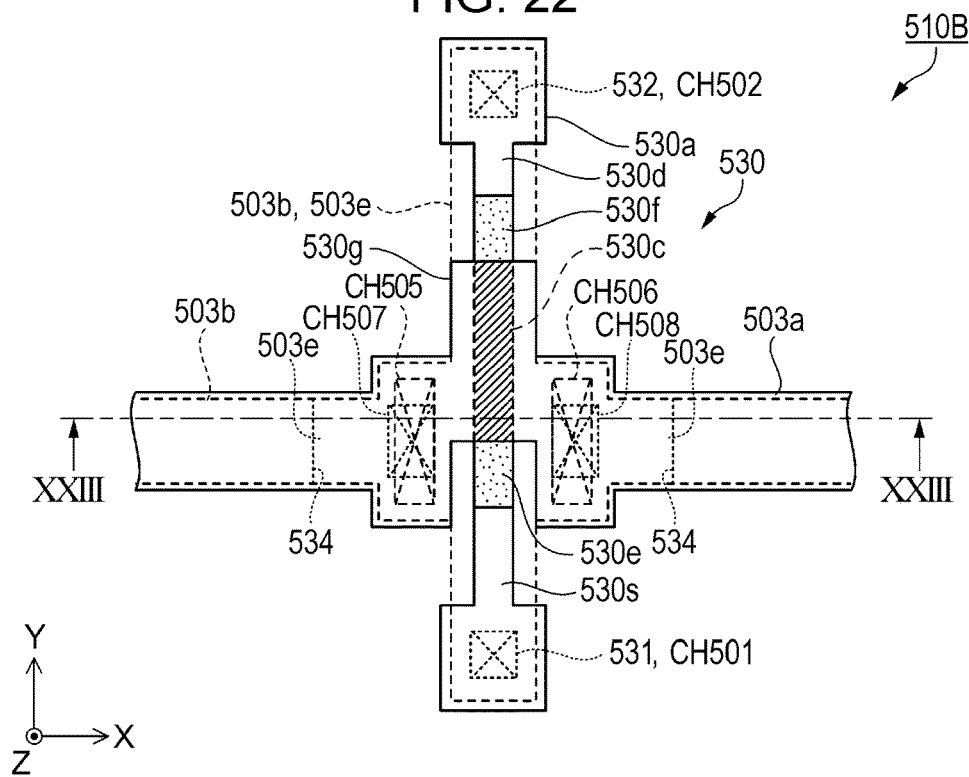
FIG. 22 is a schematic plan view illustrating the configuration of a TFT portion of an element substrate according to a sixth embodiment.
Figure 23:
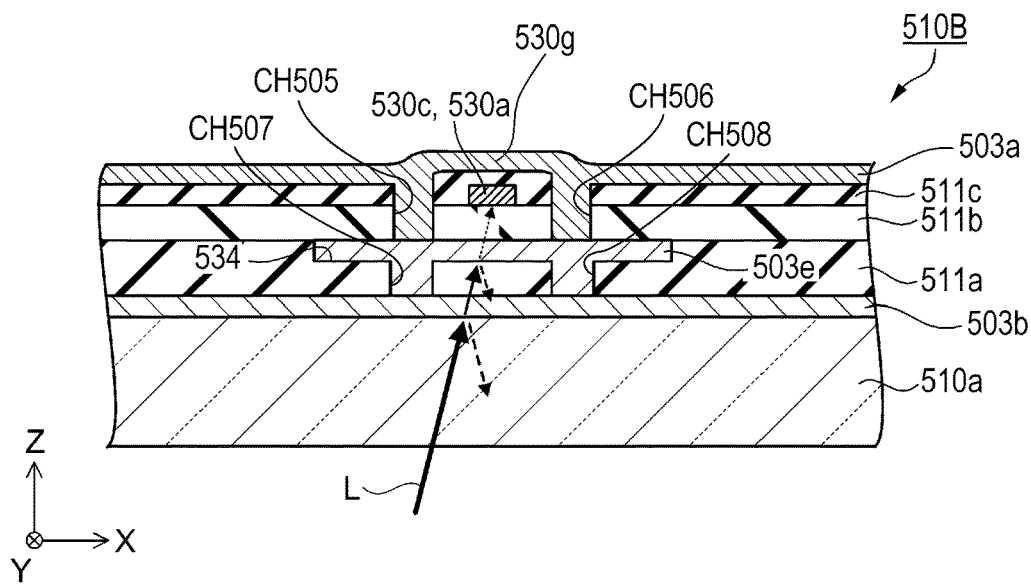
FIG. 23 is a schematic sectional view taken along line XXIII-XXIII in FIG. 22.

Next, the light shielding configuration of the element substrate according to a sixth embodiment will be described with reference to FIGS. 22 and 23. FIG. 22 is a schematic plan view illustrating the configuration of the TFT portion of the element substrate according to the sixth embodiment. FIG. 23 is a schematic sectional view taken along line XXIII-XXIII in FIG. 22.

The element substrate 510B according to the sixth embodiment is similar to the element substrate 510A according to the fifth embodiment, in that the upper light shielding layer 503e as a second light shielding layer is formed to be separated for each pixel P. However, the element substrate 510B according to the sixth embodiment is different from the element substrate 510A according to the fifth embodiment, in that the contact holes CH505 and CH506 are disposed so as to overlap with the contact holes CH507 and CH508 in a plan view. Hereinafter, the differences from the above-described embodiment will be described. The same reference numerals are given to the same components as those of the above-described embodiment, and detailed description thereof will be omitted.

As illustrated in FIGS. 22 and 23, the element substrate 510B according to the sixth embodiment is provided with the lower light shielding layer 503b, the interlayer insulating layer 511a and the upper light shielding layer 503e, between the substrate 510a and the semiconductor layer 530a. The contact holes CH507 and CH508 is formed in the interlayer insulating layer 511a, and a recess portion 534 recessed from the surface (upper surface) is formed in the region including the contact holes CH507 and CH508.

The upper light shielding layer 503e according to the sixth embodiment is formed of the same material as that of the upper light shielding layer 503c according to the fourth embodiment, and formed to have the same thickness as that of the upper light shielding layer 503c according to the fourth embodiment. The upper light shielding layer 503e is separated for each pixel P, and formed so as to fill the recess portion 534 and the contact holes CH507 and CH508 that are provided in the interlayer insulating layer 511a. The surface of the upper light shielding layer 503e is a substantially flat surface that also includes the positions of the contact holes CH507 and CH508. The surface of the upper light shielding layer 503e and the surface of the interlayer insulating layer 511a form a substantially flat surface. The upper light shielding layer 503e is electrically connected to the lower light shielding layer 503b via the contact holes CH507 and CH508.

The element substrate 510B according to the sixth embodiment can be manufactured as follows. After forming the contact holes CH507 and CH508 in the interlayer insulating layer 511a, the recess portion 534 is formed by etching the interlayer insulating layer 511a from the surface side. Then, the material of the upper light shielding layer 503e is placed so as to fill the recess portion 534 and the contact holes CH507 and CH508, and the upper light shielding layer 503e is patterned. Then, a planarization process for planarizing the surface of the upper light shielding layer 503e and the surface of the interlayer insulating layer 511a is performed.

In the element substrate 510B according to the sixth embodiment, the contact hole CH507 is disposed so as to overlap with the contact hole CH505 in a plan view, and the contact hole CH508 is disposed so as to overlap with the contact hole CH506 in a plan view. In the element substrate 510B, the surface of the upper light shielding layer 503e is a substantially flat surface, and thus the positions of the contact holes CH505 and CH506 to be formed on the upper layer of the upper light shielding layer 503e are not restricted. In other words, the positions of the contact holes CH507 and CH508 are not restricted with respect to the positions of the contact holes CH505 and CH506.

Therefore, it is possible to reduce the size of the region that is shielded by the contact holes CH505, CH506, CH507 and CH508, thereby improving the aperture ratio of the liquid crystal device 501. Accordingly, the configuration of the element substrate 510B according to the sixth embodiment is suitable in a case where the liquid crystal device 501 is a small high-definition liquid crystal device in which the arrangement pitch of the pixels P is narrow. Further, the surface of the upper light shielding layer 503e and the surface of the interlayer insulating layer 511a are a substantially flat surface, and thus it is possible to decrease the step that occurs in the upper layer due to the thickness of the upper light shielding layer 503e.

According to the configuration of the element substrate 510B of the sixth embodiment, the following effects can be obtained.

(11) Even though the upper light shielding layer 503e is separated for each pixel P, the lower light shielding layer 503b, the interlayer insulating layer 511a, and the upper light shielding layer 503e are disposed between the substrate 510a and the semiconductor layer 530a, and thus it is possible to improve the light shielding properties compared to the related art, similarly to the fourth embodiment. Further, it is possible to decrease the wiring resistance of the scanning line.

(12) The upper light shielding layer 503e having a substantially flat surface is formed on the interlayer insulating layer 511a by filling the pair of the contact holes CH507 and CH508 penetrating the interlayer insulating layer 511a. Therefore, in a case of forming the contact holes CH505 and CH506 for electrical connection from the upper side to the upper light shielding layer 503e, the positions of the contact holes CH505 and CH506 are not restricted, and thus it is possible to increase the degree of freedom in the wiring pattern design.

(13) The pair of the contact holes CH507 and CH508 that penetrate the interlayer insulating layer 511a and electrically connect the lower light shielding layer 503b and the upper light shielding layer 503e are disposed so as to overlap with the pair of the contact holes CH505 and CH506 that penetrate the gate insulating layer 511c and the interlayer insulating layer 511b and electrically connect the gate electrode 530g and the upper light shielding layer 503e in a plan view. Therefore, it is possible to reduce the size of the region that is shielded by the contact holes CH505, CH506, CH507 and CH508, thereby improving the aperture ratio of the liquid crystal device 501.

Seventh Embodiment

Light Shielding Configuration of Element Substrate

Figure 24:
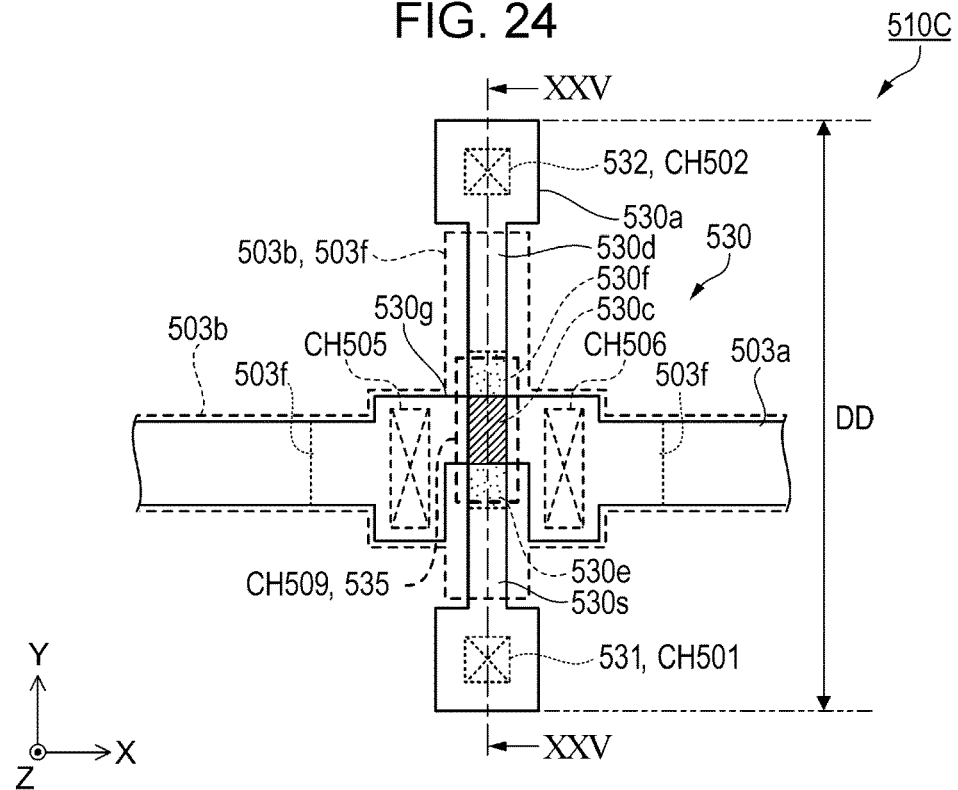
FIG. 24 is a schematic plan view illustrating the configuration of a TFT portion of an element substrate according to a seventh embodiment.
Figure 25:
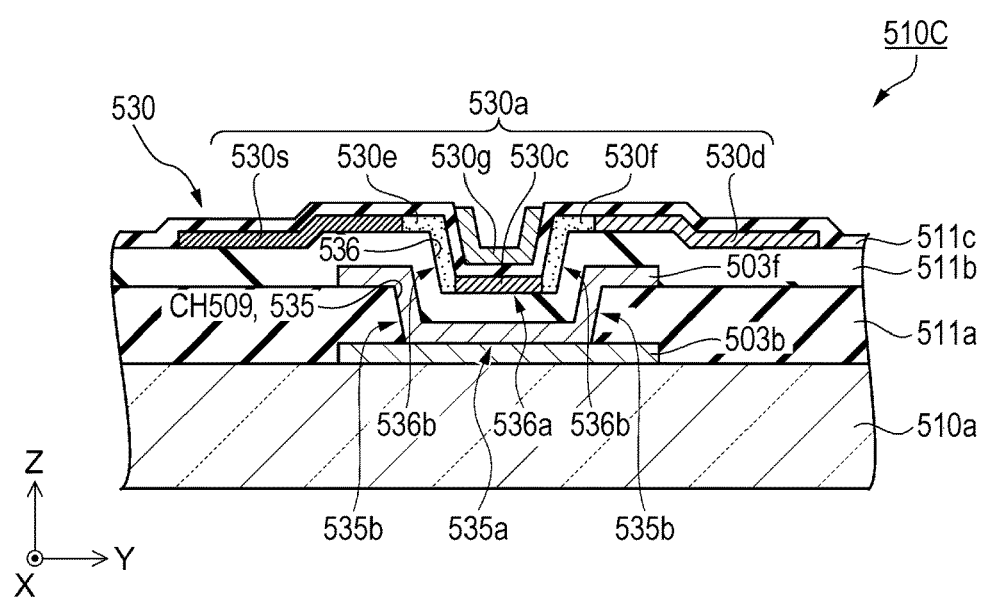
FIG. 25 is a schematic sectional view taken along line XXV-XXV in FIG. 24.

Next, the light shielding configuration of an element substrate according to a seventh embodiment will be described with reference to FIGS. 24 and 25. FIG. 24 is a schematic plan view illustrating the configuration of the TFT portion of the element substrate according to the seventh embodiment. FIG. 25 is a schematic sectional view taken along line XXV-XXV in FIG. 24. The line XXV-XXV in FIG. 24 is a line along the Y-direction to which the semiconductor layer 530a extends.

The element substrate 510C according to the seventh embodiment is different from the element substrates 510, 510A, and 510B according to the above-described embodiments, in that a contact hole CH509 which penetrates the interlayer insulating layer 511a and electrically connects the lower light shielding layer 503b and an upper light shielding layer 503f as a second light shielding layer is disposed at the position overlapped with the channel region 530c of the semiconductor layer 530a in a plan view. Hereinafter, the differences from the above-described embodiments will be described. The same reference numerals are given to the same components as those of the above-described embodiments, and detailed description thereof will be omitted.

As illustrated in FIGS. 24 and 25, the element substrate 510C according to the seventh embodiment is provided with the lower light shielding layer 503b, the interlayer insulating layer 511a, and the upper light shielding layer 503f between the substrate 510a and the semiconductor layer 530a. The upper light shielding layer 503f according to the seventh embodiment is formed of the same material as that of the upper light shielding layer 503c according to the fourth embodiment, and formed to have the same thickness as that of the upper light shielding layer 503c according to the fourth embodiment. Further, the contact holes CH505 and CH506 are disposed at both outsides of the semiconductor layer 530a in a plan view (refer to FIG. 24), similarly to the fourth embodiment.

In the interlayer insulating layer 511a, a through hole 535 (contact hole CH509 as a fifth contact hole) is provided at the position overlapped with the channel region 530c of the semiconductor layer 530a in a plan view. It is preferably that the through hole 535 is formed in a region that includes the channel region 530c of the semiconductor layer 530a and is wider than the channel region 530c in the X-direction and the Y-direction. The length of the through hole 535 along the Y-direction is, for example, approximately 2 μm, and the depth of the through hole 535 is, for example, approximately 0.5 μm.

As illustrated in FIG. 25, the through hole 535 is provided in the region overlapped with the lower light shielding layer 503b in a plan view. Thus, at the time of forming the through hole 535 in the interlayer insulating layer 511a, the lower light shielding layer 503b is exposed into the through hole 535. In this specification, the side portion (inclined surface)

of the through hole 535 formed in the interlayer insulating layer 511a is referred to as the side portion 535b of the contact hole CH509, and the surface of the lower light shielding layer 503b exposed into the through hole 535 is referred to as the bottom portion 535a of the contact hole CH509.

In the sectional view taken along the extending direction of the semiconductor layer 530a illustrated in FIG. 25, the upper light shielding layer 503f is disposed across the bottom portion 535a of the contact hole CH509 (the surface of the lower light shielding layer 503b exposed into the through hole 535), the side portions 535b of the contact hole CH509, and the surface of the interlayer insulating layer 511a positioned at the outside of the contact hole CH509. The upper light shielding layer 503f is electrically connected to the lower light shielding layer 503b while being contact with the lower light shielding layer 503b at the bottom portion 535a of the contact hole CH509.

As described above, the upper light shielding layer 503f is formed in a recessed shape in a sectional view. Thus, the upper light shielding layer 503f is disposed so as to cover the bottom portion 535a of which the channel region 530c of the semiconductor layer 530a is disposed on the upper layer, the side portions 535b, and the surface of the interlayer insulating layer 511a at the outside of the side portion. Therefore, it is possible to effectively shield light incident to the channel region 530c.

The interlayer insulating layer 511b is formed so as to cover the interlayer insulating layer 511a and the upper light shielding layer 503f. In a case where the thickness of the interlayer insulating layer 511b formed on the interlayer insulating layer 511a is approximately 5300 nm to 400 nm as described above, the thickness of the interlayer insulating layer 511b at the side portion 535b of the contact hole CH509 is, for example, approximately 200 nm. The shape of the upper light shielding layer 503f formed along the bottom portion 535a and the side portions 535b of the contact hole CH509 is reflected in the surface of the interlayer insulating layer 511b, and thus a recess portion 536 that includes a bottom portion 536a corresponding to the bottom portion 535a and side portions 536b corresponding to the side portions 535b, is formed on the surface side of the interlayer insulating layer 511b. The length of the bottom portion 536a along the Y-direction is, for example, approximately 1.5 µm.

The semiconductor layer 530a is disposed on the interlayer insulating layer 511b so as to cover the upper light shielding layer 503f along the bottom portion 536a and the side portions 536b of the recess portion 536. As described above, the semiconductor layer 530a is formed in a recessed shape in a sectional view, and thus it is possible to make the substantial length of the semiconductor layer 530a longer than the length DD of the semiconductor layer 530a in a plan view that is illustrated in FIG. 24.

In other words, it is possible to make the length DD of the semiconductor layer 530a in a plan view shorter than the length of the semiconductor layer 530a that is originally required. Therefore, it is possible to reduce the size of the light shielding region, thereby improving the aperture ratio of the liquid crystal device 501. Accordingly, the configuration of the element substrate 510C according to the seventh embodiment is suitable in a case where the liquid crystal device 501 is a small high-definition liquid crystal device in which the arrangement pitch of the pixels P is narrow.

The gate insulating layer 511c is formed so as to cover the interlayer insulating layer 511b and the semiconductor layer 530a. The gate electrode 530g is formed on the gate insulating layer 511c so as to be opposed to the channel region 530c. The shape of the recess portion 536 is also reflected in the surface of the gate insulating layer 511c, and thus the gate electrode 530g is also formed along the bottom portion 536a and the side portions 536b of the recess portion 536. Accordingly, it is possible to reduce the width of the gate electrode 530g in a plan view. The gate electrode 530g is formed at both outsides of the semiconductor layer 530a (channel region 530c) in the X-direction, and electrically connected to the upper light shielding layer 503f via the contact holes CH505 and CH506 penetrating the gate insulating layer 511c and the interlayer insulating layer 511b (refer to FIG. 24).

Here, at least the channel region 530c of the semiconductor layer 530a is preferably disposed on the bottom portion 536a of the recess portion 536. The channel region 530c is disposed on the bottom portion 536a of the recess portion 536, and thus it is possible to ensure the channel length of the channel region 530c. In addition, it is possible to dispose the data line side LDD region 530e and the pixel electrode side LDD region 530f that are disposed at both outsides of the channel region 530c in a region from the bottom portion 536a to the outsides of the recess portion 536 via the side portions 536b. Thus, it is possible to ensure the LDD region having a sufficient length. Therefore, even in a case where the liquid crystal device 501 is a small high-definition liquid crystal device in which the arrangement pitch of the pixels P is narrow, it is possible to form the TFT 530 having excellent operation characteristics.

It is assumed that the diameter of the bottom portion 535a of the contact hole CH509 (through hole 535) formed in the lower side interlayer insulating layer 511a is appropriately set such that the diameter of the bottom portion 536a is equal to or greater than the desired channel length of the channel region 530c.

According to the configuration of the element substrate 510C of the seventh embodiment, the following effects can be obtained.

(14) In the sectional view taken along the extending direction of the semiconductor layer 530a, the upper light shielding layer 503f is disposed across the bottom portion 535a of the contact hole CH509 penetrating the interlayer insulating layer 511a, the side portions 535b of the contact hole CH509, and the surface of the interlayer insulating layer 511a at the outsides of the contact hole CH509. The semiconductor layer 530a is disposed so as to cover the upper light shielding layer 503f via the interlayer insulating layer 511b. Therefore, it is possible to make the substantial length of the semiconductor layer 530a longer than the length DD of the semiconductor layer in a plan view. In other words, it is possible to make the length DD of the semiconductor layer 530a in a plan view shorter than the length of the semiconductor layer 530a that is required. Thus, it is possible to reduce the size of the light shielding region, thereby improving the aperture ratio of the liquid crystal device 501.

(15) At least the channel region 530c of the semiconductor layer 530a is disposed on the bottom portion 535a of the contact hole CH509. Thus, even in a case where the size of the liquid crystal device 501 is small, it is possible to ensure the channel length of the channel region 530c. In a case where the data line side LDD region 530e and the pixel electrode side LDD region 530f are disposed at both outsides of the channel region 530c, it is possible to dispose the data line side LDD region 530e and the pixel electrode side LDD region 530f in a region from the bottom portion 535a to the outsides of the contact hole CH509 via the side portions 535b. Thus, it is possible to ensure the LDD region having a sufficient length. Therefore, it is possible to form the TFT 530 with excellent operating characteristics. Further, the upper light shielding layer 503f that is disposed in the lower layer of the semiconductor layer 530a is disposed so as to cover the bottom portion 535a of the contact hole on which the channel region 530c is disposed, the side portions 535b of the contact hole, and the surface of the interlayer insulating layer 511a at the outsides of the contact hole CH509. Thus, it is possible to effectively shield light incident to the channel region 530c.

The configuration of the element substrate 510C according to the seventh embodiment can be also applied to the fourth embodiment, the fifth embodiment, and the sixth embodiment.

Eighth Embodiment

Electronic Apparatus

Figure 26:
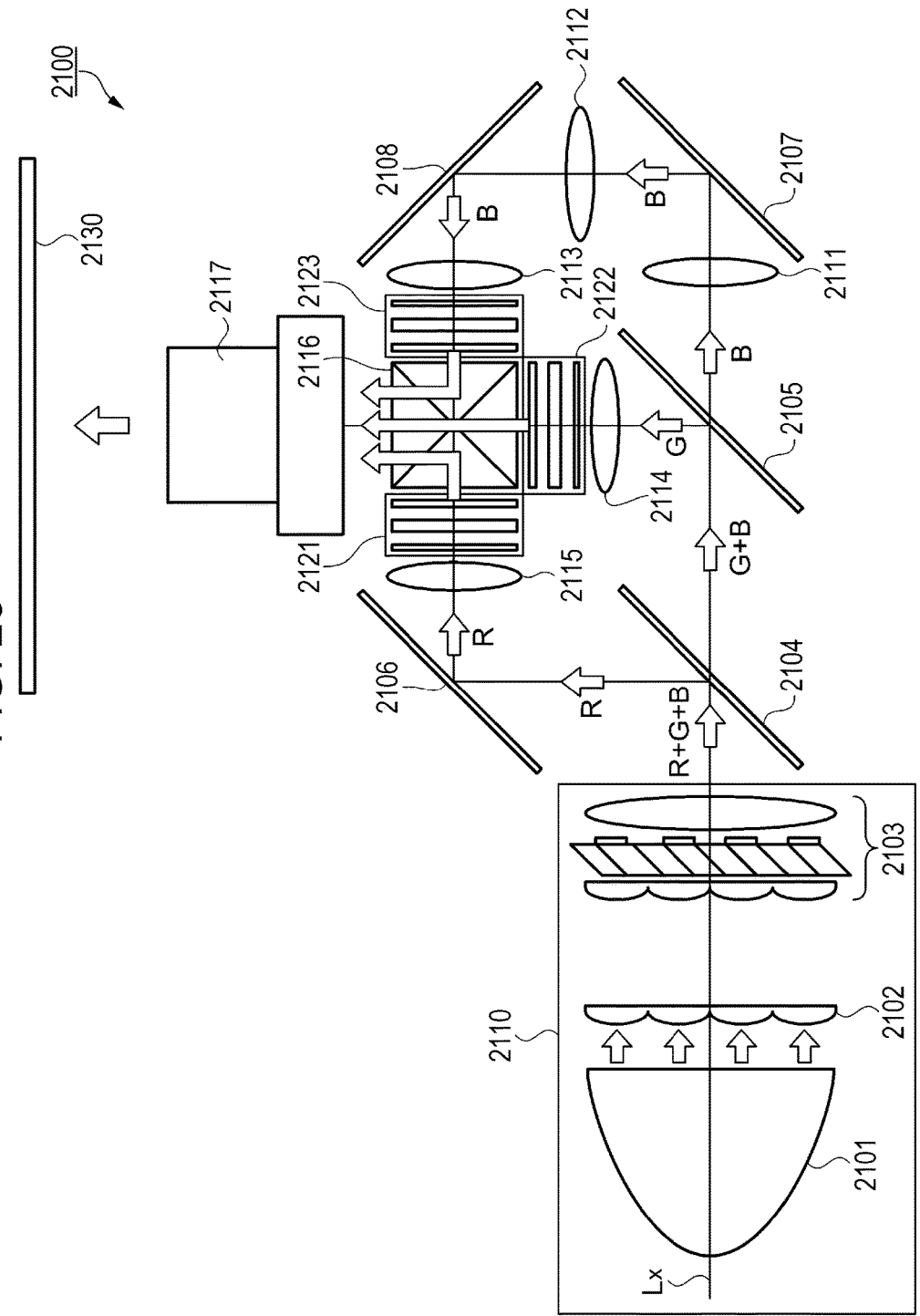
FIG. 26 is a schematic diagram illustrating the configuration of a projector as an electronic apparatus according to an eighth embodiment.

Next, an electronic apparatus according to an eighth embodiment will be described with reference to FIG. 26. FIG. 26 is a schematic diagram illustrating the configuration of a projector as an electronic apparatus according to the eighth embodiment.

As illustrated in FIG. 26, the projector (projection type display apparatus) 2100 as an electronic apparatus according to the eighth embodiment includes a polarization illumination device 2110, two dichroic mirrors 2104 and 2105 as a light separation element, three reflection mirrors 2106, 2107, and 2108, five relay lenses 2111, 2112, 2113, 2114, and 2115, three liquid crystal light bulbs 2121, 2122, and 2123, a cross dichroic prism 2116 as a light synthesizing element, and a projection lens 2117.

The polarization illumination device 2110 includes a lamp unit 2101 as a light source that is configured by a white light source such as an ultra-high pressure mercury lamp or a halogen lamp, an integrator lens 2102, and a polarization conversion element 2103. The lamp unit 2101, the integrator lens 2102, and the polarization conversion element 2103 are disposed along the system optical axis Lx.

The dichroic mirror 2104 reflects red light (R) among polarized light beams emitted from the polarization illumination device 2110, and transmits green light (G) and blue light (B). Another dichroic mirror 2105 reflects the green light (G) transmitted through the dichroic mirror 2104, and transmits the blue light (B).

The red light (R) reflected by the dichroic mirror 2104 is reflected by the reflection mirror 2106, and then incident to the liquid crystal light bulb 2121 via the relay lens 2115. The green light (G) reflected by the dichroic mirror 2105 is incident to the liquid crystal light bulb 2122 via the relay lens 2114. The blue light (B) transmitted through the dichroic mirror 2105 is incident to the liquid crystal light bulb 2123 via a light guide system that is configured by three relay lenses 2111, 2112, and 2113 and two reflection mirrors 2107 and 2108.

The projection type liquid crystal light bulbs 2121, 2122, and 2123 as a light modulation element are respectively disposed opposite to the incidence plane of each color light of the cross dichroic prism 2116. Each color light incident to the liquid crystal light bulbs 2121, 2122, and 2123 is modulated based on video information (video signal), and emitted toward the cross dichroic prism 2116.

The cross dichroic prism 2116 is formed by bonding four right-angle prisms. In the inner surface of the prism, a dielectric multilayer film that reflects the red light and a dielectric multilayer film that reflects the blue light are formed in a cross shape. Three color light beams are synthesized by the dielectric multilayer films, and thus light beams representing a color image are synthesized. Light beams that are synthesized are projected on a screen 2130 by the projection lens 2117 as a projection optical system, and thus the image is enlarged and displayed.

The liquid crystal device 501 according to the above-described embodiment is applied to the liquid crystal light bulb 2121. The liquid crystal light bulb 2121 is disposed with a gap between a pair of polarization elements that are disposed in a crossed nicol state at the incident side and the emitting side of the color light. The other liquid crystal light bulbs 2122 and 2123 are similar to the liquid crystal light bulb 2121.

According to the configuration of the projector 2100 of the eight embodiment, even though the plurality of pixels P are disposed with high precision, there is provided the liquid crystal device 501 that has high aperture ratio in the pixel region in which light is transmitted and can prevent the occurrence of light leakage current in the TFT 530. Thus, it is possible to provide the projector 2100 that has high quality and emits bright light.

The embodiment according to the invention is not limited to the embodiment described above, and can be suitably modified within a scope without departing from the essence or spirit of the invention read from the claims and the entire specification. The modification example of the invention falls within a technical scope of the invention, and may be implemented in the following forms.

Modification Example 1

As described above, the light shielding layer in the peripheral region E1 is not limited to only the first light shielding layer 3c1, and two layers of the first light shielding layer 3c1 and the second light shielding layer 3c2 may be disposed.

Modification Example 2

The second light shielding layer 3c2 according to the first embodiment is not limited to be in a floating state, for example, and may be electrically connected to the gate electrode 30g by providing a contact hole.

Modification Example 3

The element substrates 510, 510A, 510B, and 510C according to the embodiments have a configuration in which the thickness of the lower light shielding layer 503b is thick (approximately 200 nm) and the thicknesses of the upper light shielding layers 503c, 503d, 503e, and 503f are thin (approximately 100 nm). However, the invention is not limited to the embodiments. The element substrate according to the invention may have a configuration in which the thickness of the lower light shielding layer 503b is thin (approximately 100 nm) and the thicknesses of the upper light shielding layers 503c, 503d, 503e, and 503f are thick (approximately 200 nm). Even in the configuration, the same effects as those of the embodiments can be obtained.

Modification Example 4

The element substrates 510A and 510B according to the fifth and sixth embodiments have a configuration in which the lower light shielding layer 503b is formed straddling the boundary between the pixels P and the upper light shielding layers 503*d* and 503*e* are separated for each pixel P. However, the invention is not limited to the embodiments. The element substrate according to the invention may have a configuration in which lower light shielding layer 503*b* is separated for each pixel P and the upper light shielding layers 503*d* and 503*e* are formed straddling the boundary between the pixels P. Even in the configuration, the same effects as those of the embodiments can be obtained.

Modification Example 5

The display apparatus that can apply the light shielding configurations of the element substrates 510, 510A, 510B, and 510C according to the embodiments is not limited to the liquid crystal device 501. The light shielding configurations of the element substrates 510, 510A, 510B, and 510C may be applied to a display apparatus such as an organic EL apparatus, a plasma display, or an electronic paper.

Modification Example 6

The electronic apparatus that can apply the liquid crystal device 501 according to the embodiment is not limited to the projector 2100. The liquid crystal device 501 can be suitably used, for example, as a projection type HUD (head-up display) or a direct-view type HMD (head-mounted display), or a display unit of an information terminal device such as an electronic book, a personal computer, a digital still camera, a liquid crystal television, a view finder type or monitor direct-view type video recorder, a car navigation system, an electronic organizer, or a POS.

The entire disclosure of Japanese Patent Application No. 2015-227375, filed Nov. 20, 2015 and 2015-212624, filed Oct. 29, 2015 are expressly incorporated by reference herein.

What is claimed is:

1. A liquid crystal device, comprising: a substrate;
a liquid crystal layer disposed on the substrate;
a first light shielding layer disposed between the substrate and the liquid crystal layer;
a second light shielding layer disposed between the first light shielding layer and the liquid crystal layer;
a first transistor provided between the second light shielding layer and the liquid crystal layer in a display region; and
a second transistor provided between the first light shielding layer and the liquid crystal layer in a peripheral region that is a region around the display region,
wherein the first transistor overlaps with at least the second light shielding layer in a plan view, and
wherein the second transistor overlaps with at least the first light shielding layer in the plan view, and
wherein the first light shielding layer and the second light shielding layer are electrically connected to a gate electrode of the first transistor by one contact hole.

2. The liquid crystal device according to claim 1, wherein the first transistor overlaps with the first light shielding layer and the second light shielding layer in the plan view.

3. The liquid crystal device according to claim 1,
wherein at least one of the first light shielding layer and the second light shielding layer is made of a material having a light reflection property.

4. The liquid crystal device according to claim 3,
wherein materials of the first light shielding layer and the second light shielding layer are tungsten silicide.

5. A liquid crystal device comprising:
a first substrate;
a second substrate disposed opposite to the first substrate;
a liquid crystal layer interposed between the first substrate and the second substrate;
a switching element including a semiconductor layer that is disposed on the first substrate for each pixel and includes a channel region, a gate insulating layer covering the semiconductor layer, and a gate electrode disposed opposite to the channel region via the gate insulating layer;
a first light shielding layer that is disposed on the first substrate and overlaps with the semiconductor layer in a plan view and is set to the same potential as the potential of the gate electrode;
a first insulating layer that covers the first light shielding layer;
a second light shielding layer that is disposed on the first insulating layer and overlaps with the semiconductor layer and the first light shielding layer in the plan view and is set to the same potential as the potential of the gate electrode; and
a second insulating layer that covers the second light shielding layer,
wherein the first light shielding layer, the first insulating layer, the second light shielding layer, and the second insulating layer are provided between the first substrate and the semiconductor layer.

6. The liquid crystal device according to claim 5,
wherein the first light shielding layer or the second light shielding layer is formed straddling a boundary between two pixels.

7. The liquid crystal device according to claim 5,
wherein the first light shielding layer or the second light shielding layer is formed to be separated for each pixel.

8. The liquid crystal device according to claim 5, further comprising:
a first contact hole and a second contact hole that penetrate the first insulating layer and electrically connect the first light shielding layer and the second light shielding layer,
wherein the first contact hole and the second contact hole are disposed at both outsides of the semiconductor layer in a direction intersecting the extending direction of the semiconductor layer in the plan view.

9. The liquid crystal device according to claim 8,
wherein the second light shielding layer fills the first contact hole and the second contact hole, and has a substantially flat surface.

10. The liquid crystal device according to claim 9, further comprising:
a third contact hole and a fourth contact hole that penetrate the gate insulating layer and the second insulating layer and electrically connect the gate electrode and the second light shielding layer,
wherein the third contact hole overlaps with the first contact hole in the plan view, and the fourth contact hole overlaps with the second contact hole in the plan view.

11. The liquid crystal device according to claim 5, further comprising:
a fifth contact hole that penetrates the first insulating layer and electrically connects the first light shielding layer and the second light shielding layer,
wherein, in the sectional view taken along the extending direction of the semiconductor layer, the second light shielding layer is disposed across the bottom portion and the side portions of the fifth contact hole, and the surface of the first insulating layer positioned at the outsides of the fifth contact hole, and wherein, in the sectional view taken along the extending direction of the semiconductor layer, the semiconductor layer covers the second light shielding layer via the second insulating layer.

12. The liquid crystal device according to claim 11, wherein at least the channel region of the semiconductor layer is disposed at the bottom portion of the fifth contact hole.

13. The liquid crystal device according to claim 11, further comprising:

a third contact hole and a fourth contact hole that penetrate the gate insulating layer and the second insulating layer and electrically connect the gate electrode and the second light shielding layer, wherein the third contact hole and the fourth contact hole are disposed at both outsides of the semiconductor layer in a direction intersecting the extending direction of the semiconductor layer in the plan view.

14. The liquid crystal device according to claim 6, further comprising:

a plurality of contact holes that penetrate the first insulating layer and electrically connect the first light shielding layer and the second light shielding layer, wherein the number of the contact holes is less than the number of the pixels.

15. A liquid crystal device, comprising:

a substrate;

a liquid crystal layer disposed on the substrate;

a first light shielding layer disposed between the substrate and the liquid crystal layer;

a second light shielding layer disposed between the first light shielding layer and the liquid crystal layer;

a first transistor provided between the second light shielding layer and the liquid crystal layer in a display region; and a second transistor provided between the first light shielding layer and the liquid crystal layer in a peripheral region that is a region around the display region, wherein the first transistor overlaps with at least the second light shielding layer in a plan view, the second transistor overlaps with at least the first light shielding layer in the plan view, at least one of the first light shielding layer and the second light shielding layer is made of a material having a light reflection property, and materials of the first light shielding layer and the second light shielding layer are tungsten silicide.

16. An electronic apparatus comprising:
the liquid crystal device according to claim 1.

17. An electronic apparatus comprising:
the liquid crystal device according to claim 2.

18. An electronic apparatus comprising:
the liquid crystal device according to claim 3.

19. An electronic apparatus comprising:
the liquid crystal device according to claim 4.

* * * * *